(12) United States Patent
Park et al.

(10) Patent No.: US 11,527,197 B2
(45) Date of Patent: Dec. 13, 2022

(54) DISPLAY DEVICE

(71) Applicant: Samsung Display Co., LTD., Yongin-si (KR)

(72) Inventors: Hyun Ae Park, Hwaseong-si (KR); Hwan Soo Jang, Asan-si (KR); Kyong Hwan Oh, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/517,087

(22) Filed: Nov. 2, 2021

(65) Prior Publication Data

US 2022/0238067 A1 Jul. 28, 2022

(30) Foreign Application Priority Data

Jan. 25, 2021 (KR) .................... 10-2021-0009880

(51) Int. Cl.
  *G09G 3/32* (2016.01)
(52) U.S. Cl.
  CPC ....... *G09G 3/32* (2013.01); *G09G 2300/0426* (2013.01); *G09G 2300/0809* (2013.01); *G09G 2310/08* (2013.01)
(58) Field of Classification Search
  CPC ............. G09G 3/32; G09G 2300/0426; G09G 2300/0809; G09G 2310/08
  See application file for complete search history.

(56) References Cited

U.S. PATENT DOCUMENTS

| | | | |
|---|---|---|---|
| 2017/0162099 A1* | 6/2017 | Jin | G09G 3/2003 |
| 2018/0336808 A1* | 11/2018 | Lee | G09G 3/006 |
| 2019/0347979 A1* | 11/2019 | Ahmed | G09G 3/32 |
| 2019/0385522 A1* | 12/2019 | Song | G09G 3/3266 |
| 2020/0118494 A1* | 4/2020 | Park | G09G 3/3266 |
| 2020/0176531 A1* | 6/2020 | Baek | H01L 27/3246 |
| 2020/0273397 A1* | 8/2020 | Jeong | H01L 33/62 |
| 2020/0312942 A1* | 10/2020 | Yang | H01L 27/3258 |
| 2020/0403131 A1* | 12/2020 | Kim | H01L 33/24 |
| 2021/0090502 A1* | 3/2021 | Choi | G09G 3/3258 |

FOREIGN PATENT DOCUMENTS

| | | |
|---|---|---|
| KR | 100392379 B1 | 11/2003 |
| KR | 1020190142469 A | 12/2019 |

* cited by examiner

*Primary Examiner* — Andrew Sasinowski
(74) *Attorney, Agent, or Firm* — Cantor Colburn LLP

(57) ABSTRACT

A display device includes: a plurality of scan lines; and a plurality of sub-pixels, each of the sub-pixels comprising a driving transistor, a plurality of transistors connected to the plurality of scan lines, and a light-emitting element electrically connected to the driving transistor. Each of the sub-pixels comprises an active layer comprising a channel region, a first electrode, and a second electrode of each of the plurality of transistors. A first scan line among the plurality of scan lines comprises a first extension extended in a first direction and a first protrusion extended in a second direction intersecting the first direction. The active layer overlaps with the first protrusion in a plan view.

29 Claims, 21 Drawing Sheets

DISPLAY DEVICE

This application claims priority to Korean Patent Application No. 10-2021-0009880 filed on Jan. 25, 2021, and all the benefits accruing therefrom under 35 U.S.C. § 119, the content of which in its entirety is herein incorporated by reference.

BACKGROUND

1. Field of the Disclosure

The present disclosure relates to a display device.

2. Description of the Related Art

As the information-oriented society evolves, various demands for a display device to display images are ever increasing. For example, the display device is being employed by a variety of electronic devices such as smart phones, digital cameras, laptop computers, navigation devices, and smart televisions. The display device may be a flat panel display device such as a liquid-crystal display device, afield emission display device, and an organic light-emitting display device.

An organic light-emitting display device includes a light-emitting element so that each of the pixels of the display panel can emit light by themselves. Accordingly, an organic light-emitting display device can display images without a backlight unit that supplies light to the display panel. An organic light-emitting display device may include a plurality of pixels. Each of the plurality of pixels may include a light-emitting element, a driving transistor for controlling the amount of driving current supplied from a power supply to the light-emitting element according to a voltage at the gate electrode, and a plurality of switching transistors performing switching in response to scan signals from scan lines. In each of the plurality of pixels, an active layer of the driving transistor and the plurality of switching transistors may be formed in an island pattern. In such case, a path for discharging static electricity on the active layer cannot be formed. As a result, when static electricity is applied to the active layer during the fabricating process, the active layer may be burned and damaged by static electricity.

SUMMARY

Aspects of the present disclosure provide a display device that can prevent the active layer from being damaged by static electricity.

It should be noted that aspects of the present disclosure are not limited to the above-mentioned aspect; and other aspects of the present disclosure will be apparent to those skilled in the art from the following descriptions.

According to an embodiment of the present disclosure, a display device includes: a plurality of scan lines extended in a first direction; a plurality of data lines extended in a second direction intersecting the first direction, where data voltages are applied via the data lines; a first initialization voltage line from which a first initialization voltage is applied; a second initialization voltage line from which a second initialization voltage is applied; and a plurality of sub-pixels, where each of the sub-pixels is connected to the first initialization voltage line, the second initialization voltage line, at least one of the plurality of scan lines, and at least one of the plurality of data lines. Each of the sub-pixels includes: a driving transistor which controls a driving current which flows from a first electrode thereof to a second electrode thereof according to the data voltage applied to a gate electrode thereof, a light-emitting element electrically connected to the second electrode of the driving transistor, a first transistor including a first electrode connected to the second initialization voltage line, and a second transistor and a third transistor arranged in series between the first initialization voltage line and the second initialization voltage line. A second electrode of the first transistor of an $(i+1)^{th}$ sub-pixel disposed in an $(i+1)^{th}$ row among the sub-pixels is connected to the light-emitting element of an $i^{th}$ sub-pixel disposed in an $i^{th}$ row among the sub-pixels, where i is a positive integer. The $(i+1)^{th}$ sub-pixel and the $i^{th}$ sub-pixel are connected to the same data line of among the plurality of data lines.

The second transistor and the third transistor of the $i^{th}$ sub-pixel may be not turned on simultaneously.

A gate electrode of the first transistor and a gate electrode of the second transistor of the $(i+1)^{th}$ sub-pixel may be connected to a first scan line connected to the $(i+1)^{th}$ sub-pixel among the plurality of scan lines.

A gate electrode of the third transistor of the $i^{th}$ sub-pixel may be connected to a second scan line connected to the $i^{th}$ sub-pixel among the plurality of scan lines. A scan signal applied to the first scan line connected to the $(i+1)^{th}$ sub-pixel may be identical to a scan signal applied to the second scan line connected to the $i^{th}$ sub-pixel.

A gate electrode of the first transistor and a gate electrode of the third transistor of the $i^{th}$ sub-pixel may be connected to a second scan line connected to the $i^{th}$ sub-pixel among the plurality of scan lines.

A gate electrode of the second transistor of the $i^{th}$ sub-pixel may be connected to a first scan line connected to the $i^{th}$ sub-pixel among the plurality of scan lines. A gate electrode of the third transistor of the $i^{th}$ sub-pixel may be connected to a second scan line connected to the $i^{th}$ sub-pixel among the plurality of scan lines.

A gate electrode of the first transistor of the $i^{th}$ sub-pixel may be connected to a third scan line connected to the $i^{th}$ sub-pixel among the plurality of scan lines.

The display device may further include a plurality of emission control lines extended in the first direction and arranged in parallel with the plurality of scan lines. Each of the sub-pixels may be connected to at least one of the plurality of emission control lines.

A gate electrode of the second transistor of the $i^{th}$ sub-pixel may be connected to a first scan line connected to the $i^{th}$ sub-pixel among the plurality of scan lines. A gate electrode of a third transistor of the $i^{th}$ sub-pixel may be connected to the one of the plurality of emission control lines.

A gate electrode of the second transistor of the $i^{th}$ sub-pixel may be connected to the one of the plurality of emission control lines. A gate electrode of the third transistor of the $i^{th}$ sub-pixel may be connected to a first scan line connected to the $i^{th}$ sub-pixel among the plurality of emission control lines.

The display device may further include: a plurality of driving voltage lines extended in the second direction, and a plurality of emission control lines extended in the first direction. Each of the sub-pixels may be connected to at least one of the plurality of driving voltage lines and the plurality of emission control lines. The display device may further include: a fourth transistor disposed between the gate electrode of the driving transistor and the first initialization voltage line, a fifth transistor disposed between one of the data lines and the first electrode of the driving transistor, a sixth transistor disposed between the gate electrode of the driving transistor and the second electrode of the driving transistor, a seventh transistor disposed between the one of the plurality of driving voltage lines and the first electrode of the driving transistor, an eighth transistor disposed between the second electrode of the driving transistor and a first electrode of the light-emitting element, and a first capacitor disposed between the one of the plurality of driving voltage lines and the gate electrode of the driving transistor.

A gate electrode of the first transistor, a gate electrode of the second transistor and a gate electrode of the fourth transistor of the $i^{th}$ sub-pixel may be connected to a first scan line connected to the $i^{th}$ sub-pixel among the plurality of scan lines. A gate electrode of the third transistor, a gate electrode of the fifth transistor and a gate electrode of the sixth transistor of the $i^{th}$ sub-pixel may be connected to a second scan line connected to the $i^{th}$ sub-pixel among the plurality of scan lines. A gate electrode of the first transistor of the $(i+1)^{th}$ sub-pixel may be connected to a third scan line connected to the $(i+1)^{th}$ sub-pixel among the plurality of scan lines. The same scan signal may be applied to the second scan line connected the $i^{th}$ sub-pixel and the third scan line connected the $(i+1)^{th}$ sub-pixel.

A gate electrode of the first transistor, a gate electrode of the third transistor and a gate electrode of the fourth transistor of the $i^{th}$ sub-pixel may be connected to a first scan line connected to the $i^{th}$ sub-pixel among the plurality of scan lines. A gate electrode of the second transistor, a gate electrode of the fifth transistor and a gate electrode of the sixth transistor of the $i^{th}$ sub-pixel may be connected to a second scan line connected to the $i^{th}$ sub-pixel among the plurality of scan lines. A gate electrode of the first transistor of the $(i+1)^{th}$ sub-pixel may be connected to a third scan line connected to the $(i+1)^{th}$ sub-pixel among the plurality of scan lines. The same scan signal may be applied to the second scan line connected the $i^{th}$ sub-pixel and the third scan line connected the $(i+1)^{th}$ sub-pixel.

A gate electrode of the first transistor, a gate electrode of the second transistor and a gate electrode of the fourth transistor of the $i^{th}$ sub-pixel may be connected to a first scan line connected to the $i^{th}$ sub-pixel among the plurality of scan lines. A gate electrode of the fifth transistor and a gate electrode of the sixth transistor of the $i^{th}$ sub-pixel may be connected to a second scan line connected to the $i^{th}$ sub-pixel among the plurality of scan lines. A gate electrode of the first transistor of the $(i+1)^{th}$ sub-pixel may be connected to a third scan line connected to the $(i+1)^{th}$ sub-pixel among the plurality of scan lines. A gate electrode of the third transistor of the $i^{th}$ sub-pixel may be connected to one of the plurality of emission control lines. The same scan signal may be applied to the second scan line connected the $i^{th}$ sub-pixel and the third scan line connected the $(i+1)^{th}$ sub-pixel.

A gate electrode of the first transistor and a gate electrode of the fourth transistor of the $i^{th}$ sub-pixel may be connected to a first scan line connected to the $i^{th}$ sub-pixel among the plurality of scan lines. A gate electrode of the second transistor, a gate electrode of the fifth transistor and a gate electrode of the sixth transistor of the $i^{th}$ sub-pixel may be connected to a second scan line connected to the $i^{th}$ sub-pixel among the plurality of scan lines. A gate electrode of the first transistor of the $(i+1)^{th}$ sub-pixel may be connected to a third scan line connected to the $(i+1)^{th}$ sub-pixel among the plurality of scan lines. A gate electrode of the third transistor of the $i^{th}$ sub-pixel is connected to one of the plurality of emission control lines. The same scan signal may be applied to the second scan line connected the $i^{th}$ sub-pixel and the third scan line connected the $(i+1)^{th}$ sub-pixel.

A gate electrode of the first transistor, a gate electrode of the third transistor and a gate electrode of the fourth transistor of the $i^{th}$ sub-pixel may be connected to a first scan line connected to the $i^{th}$ sub-pixel among the plurality of scan lines. A gate electrode of the fifth transistor and a gate electrode of the sixth transistor of the $i^{th}$ sub-pixel may be connected to a second scan line connected to the $i^{h}$ sub-pixel among the plurality of scan lines. A gate electrode of the first transistor of the $(i+1)^{th}$ sub-pixel may be connected to a third scan line connected to the $(i+1)^{th}$ sub-pixel among the plurality of scan lines. A gate electrode of the second transistor of the $i^{th}$ sub-pixel may be connected to one of the plurality of emission control lines. The same scan signal may be applied to the second scan line connected the $i^{th}$ sub-pixel and the third scan line connected the $(i+1)^{th}$ sub-pixel.

A gate electrode of the first transistor and a gate electrode of the fourth transistor of the $i^{th}$ sub-pixel may be connected to a first scan line connected to the $i^{th}$ sub-pixel among the plurality of scan lines. A gate electrode of the third transistor, a gate electrode of the fifth transistor and a gate electrode of the sixth transistor of the $i^{th}$ sub-pixel may be connected to a second scan line connected to the $i^{h}$ sub-pixel among the plurality of scan lines. A gate electrode of the first transistor of the $(i+1)^{th}$ sub-pixel may be connected to a third scan line connected to the $(i+1)^{th}$ sub-pixel among the plurality of scan lines. A gate electrode of the second transistor of the $i^{th}$ sub-pixel may be connected to one of the plurality of emission control lines. The same scan signal may be applied to the second scan line connected the $i^{th}$ sub-pixel and the third scan line connected the $(i+1)^{th}$ sub-pixel.

According to an embodiment of the present disclosure, a display device includes: a first initialization voltage line from which a first initialization voltage is applied, a second initialization voltage line from which a second initialization voltage is applied, and a plurality of sub-pixels, each of the sub-pixels being connected to the first initialization voltage line and the second initialization voltage line. Each of the sub-pixels includes: a driving transistor which controls a driving current which flows from a first electrode thereof to a second electrode thereof according to a data voltage applied to a gate electrode thereof, a light-emitting element electrically connected to the second electrode of the driving transistor, a first transistor including a first electrode connected to the second initialization voltage line, a second transistor and a third transistor arranged in series between the first initialization voltage line and the second initialization voltage line, and a fourth transistor disposed between the gate electrode of the driving transistor and the first initialization voltage line. A second electrode of the first transistor of an $(i+1)^{th}$ sub-pixel disposed in an $(i+1)^{th}$ row among the sub-pixels is connected to the light-emitting element of an $i^{th}$ sub-pixel disposed in an $i^{th}$ row, where i is a positive integer. At least one of the second transistor and the third transistor is turned off in each of a first time period, a second time period and a third time period, where the first initialization voltage is applied to the gate electrode of the driving transistor during the first time period, the data voltage is applied to the gate electrode of the driving transistor during the second time period, and the light-emitting element emits light during the third time period.

The second transistor and the fourth transistor of the $i^{th}$ sub-pixel may be turned on during the first time period. The first transistor of the $(i+1)^{th}$ sub-pixel may be turned on during the second time period. The third transistor of the $i^{th}$ sub-pixel may be turned on during one of the second time period and the third time period.

The fourth transistor of the $i^{th}$ sub-pixel may be turned on during the first time period. The second transistor of the $i^{th}$ sub-pixel and the first transistor of the $(i+1)^{th}$ sub-pixel may be turned on during the second time period. The third transistor of the $i^{th}$ sub-pixel may be turned on during one of the first time period and the third time period.

The fourth transistor of the $i^{th}$ sub-pixel may be turned on during the first time period. The first transistor of the $(i+1)^{th}$ sub-pixel may be turned on during the second period. The second transistor of the $i^{th}$ sub-pixel may be turned on during the third period. The third transistor of the $i^{th}$ sub-pixel may be turned on during one of the first period and the second period.

According to an embodiment of the present disclosure, a display device includes: a plurality of scan lines, and a plurality of sub-pixels, each of the sub-pixels including a driving transistor, a plurality of transistors connected to the plurality of scan lines, and a light-emitting element electrically connected to the driving transistor. Each of the sub-pixels includes an active layer including a channel region, a first electrode, and a second electrode of each of the plurality of transistors. A first scan line among the plurality of scan lines includes a first extension extended in a first direction and a first protrusion extended in a second direction intersecting the first direction. The active layer overlaps with the first protrusion in a plan view.

A second scan line among the plurality of scan lines may include a second extension extended in the first direction and a second protrusion extended in the second direction. The active layer overlaps with the second protrusion in the plan view.

The active layer of an $i^{th}$ sub-pixel among the plurality of sub-pixels may be monolithic with the active layer of an $(i+1)^{th}$ sub-pixel adjacent to the $i^{th}$ sub-pixel in the second direction, where i is a positive integer.

A first length between the first protrusion and the second extension may be different from a second length between the second protrusion and the first extension.

The display device may further include: a first initialization voltage line from which a first initialization voltage is applied, and a second initialization voltage line from which a second initialization voltage is applied. The driving transistor may control a driving current which flows from a first electrode thereof to a second electrode thereof according to a data voltage applied to a gate electrode thereof. The plurality of transistors may include: a first transistor including a first electrode connected to the second initialization voltage line, and a second transistor disposed between the first transistor and the first initialization voltage line. A region where the active layer and the first protrusion overlap each other in the plan view may be defined as a channel region of the second transistor.

The plurality of transistors may further include a third transistor disposed between the second transistor and the first initialization voltage line. A region where the active layer and the second protrusion overlap each other in the plan view may be defined as a channel region of the third transistor.

The display device may further include a first initialization voltage connection line connected to the first initialization voltage line and extended in the second direction. The active layer may overlap the first initialization voltage connection line in the plan view.

The channel region of the third transistor may overlap the first initialization voltage connection line in the plan view.

According to exemplary embodiments of the present disclosure, the active layer of a sub-pixel is connected to the active layer of other sub-pixels in a display device. Accordingly, when static electricity is applied to the active layer during the fabricating process, a path for discharging static electricity can be formed by the active layers of the sub-pixels, so that the static electricity can be discharged or dispersed. Therefore, it is possible to prevent the active layer from being burnt and damaged by static electricity during the process.

In addition, by preventing a short circuit between the first initialization voltage line applying the first initialization voltage and the second initialization voltage line applying the second initialization voltage, the first initialization voltage and the second initialization voltage do not affect each other and can be applied uniformly.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

Figure 1:
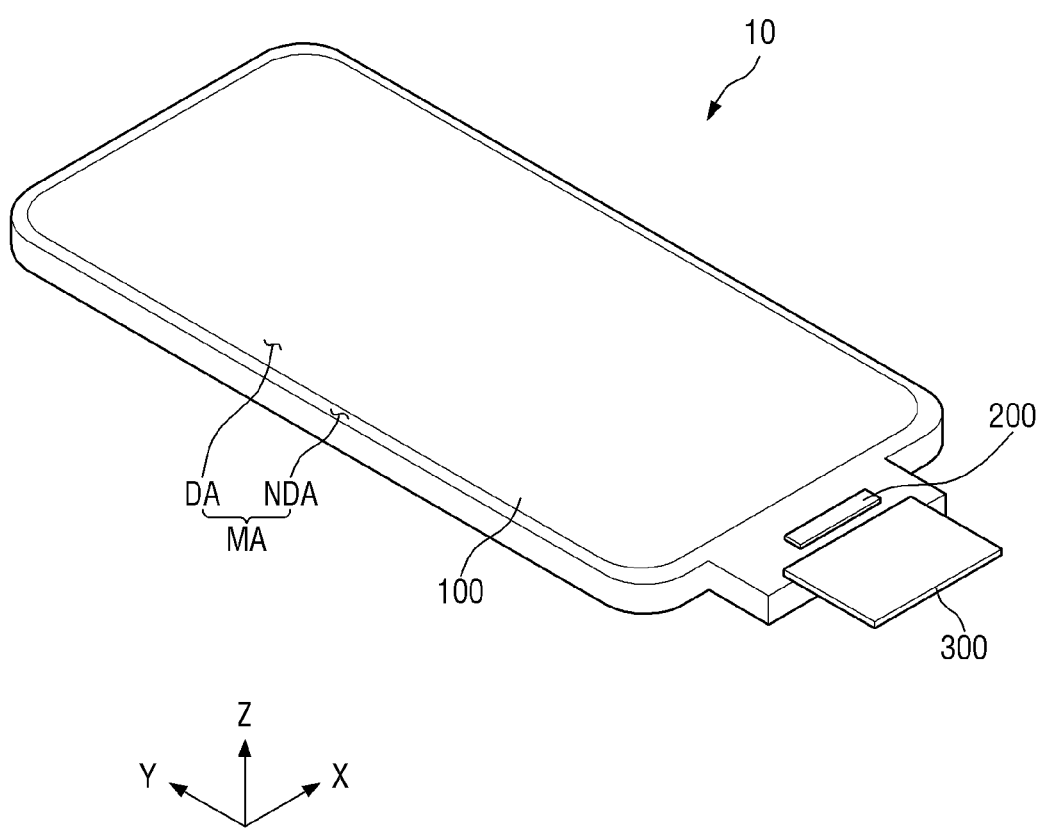
FIG. 1 is a perspective view showing a display device according to an exemplary embodiment of the present disclosure.

In the following description, for the purposes of explanation, numerous details are set forth in order to provide a thorough understanding of various embodiments or implementations of the disclosure. As used herein "embodiments" and "implementations" are interchangeable words that are non-limiting examples of devices or methods employing one or more of the implementations or embodiments disclosed herein. It is apparent, however, that various embodiments may be practiced without these details or with one or more equivalent arrangements. In other instances, structures and devices may be shown in block diagram form in order to avoid unnecessarily obscuring various embodiments. Further, various embodiments may be different, but do not have to be exclusive. For example, shapes, configurations, and characteristics of an embodiment may be used or implemented in another embodiment without departing from the scope of the disclosure.

Unless otherwise specified, the illustrated embodiments are to be understood as providing features of varying detail of some or a number of ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be substantially perpendicular to one another, or may represent different directions that may not be perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

The terms "and" and "or" may be used in the conjunctive or disjunctive sense and may be understood to be equivalent to "and/or."

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (for example, as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (for example, rotated 90 degrees or about 90 degrees or at other orientations), and, as such, the spatially relative descriptors used herein interpreted accordingly.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terminology used herein is for the purpose of describing embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," "has," and/or "having," and/or variations thereof when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

For example, "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Some or a number of embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, or the like, which may be formed using semiconductor-based fabrication techniques or other manufacturing technologies. In the case of the blocks, units, and/or modules being implemented by microprocessors or other similar hardware, they may be programmed and controlled using software (for example, microcode) to perform various functions discussed herein and may optionally be driven by firmware and/or software. It is also contemplated that each block, unit, and/or module may be implemented by dedicated hardware, or as a combination of dedicated hardware to perform some or a number of functions and a processor (for example, one or more programmed microprocessors and associated circuitry) to perform other functions. Also, each block, unit, and/or module of some or a number of embodiments may be physically separated into two or more interacting and discrete blocks, units, and/or modules without departing from the scope of the disclosure. Further, the blocks, units, and/or modules of some or a number of embodiments may be physically combined into more complex blocks, units, and/or modules without departing from the scope of the disclosure.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
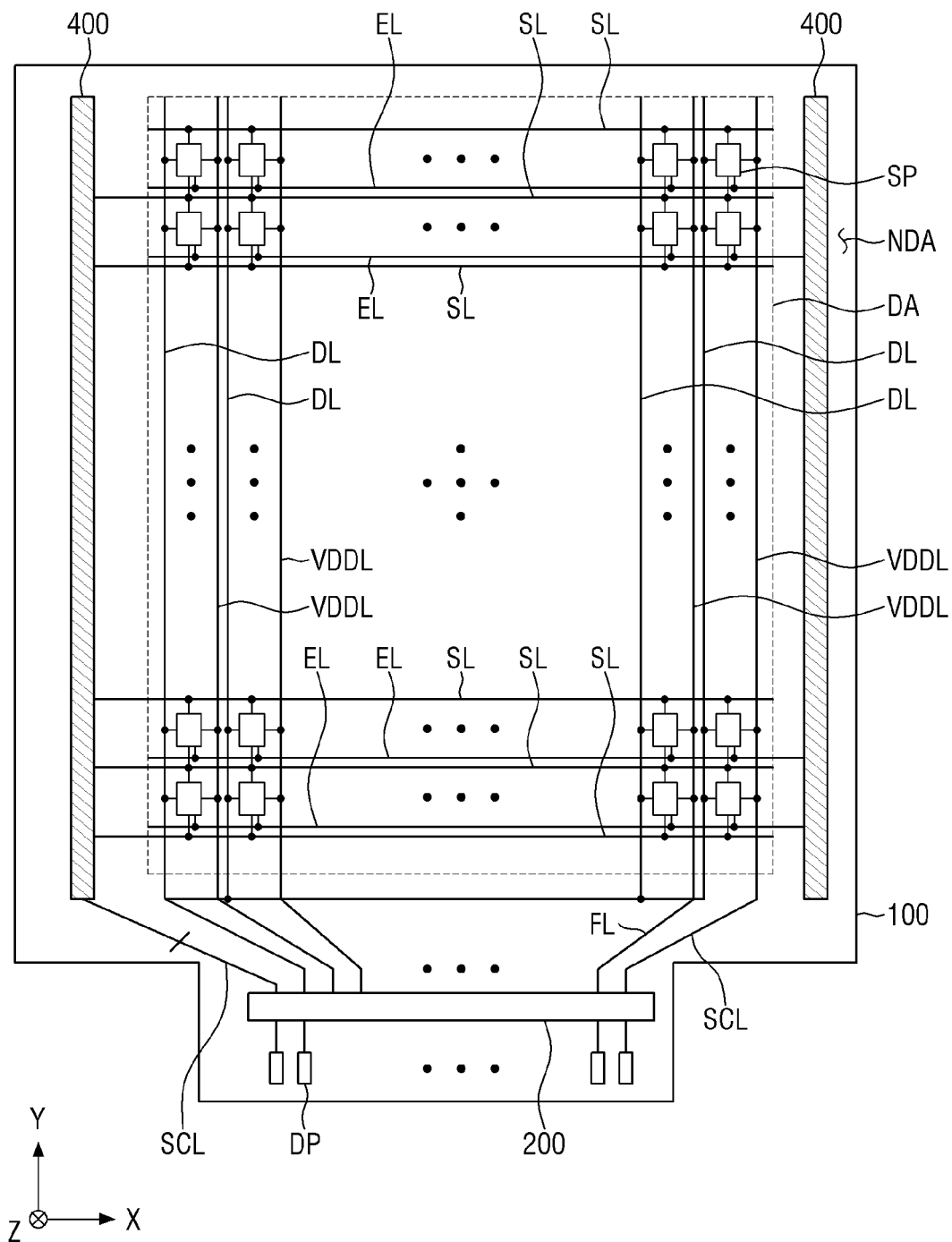
FIG. 2 is a plan view showing a display device according to an exemplary embodiment of the present disclosure.
Figure 3:
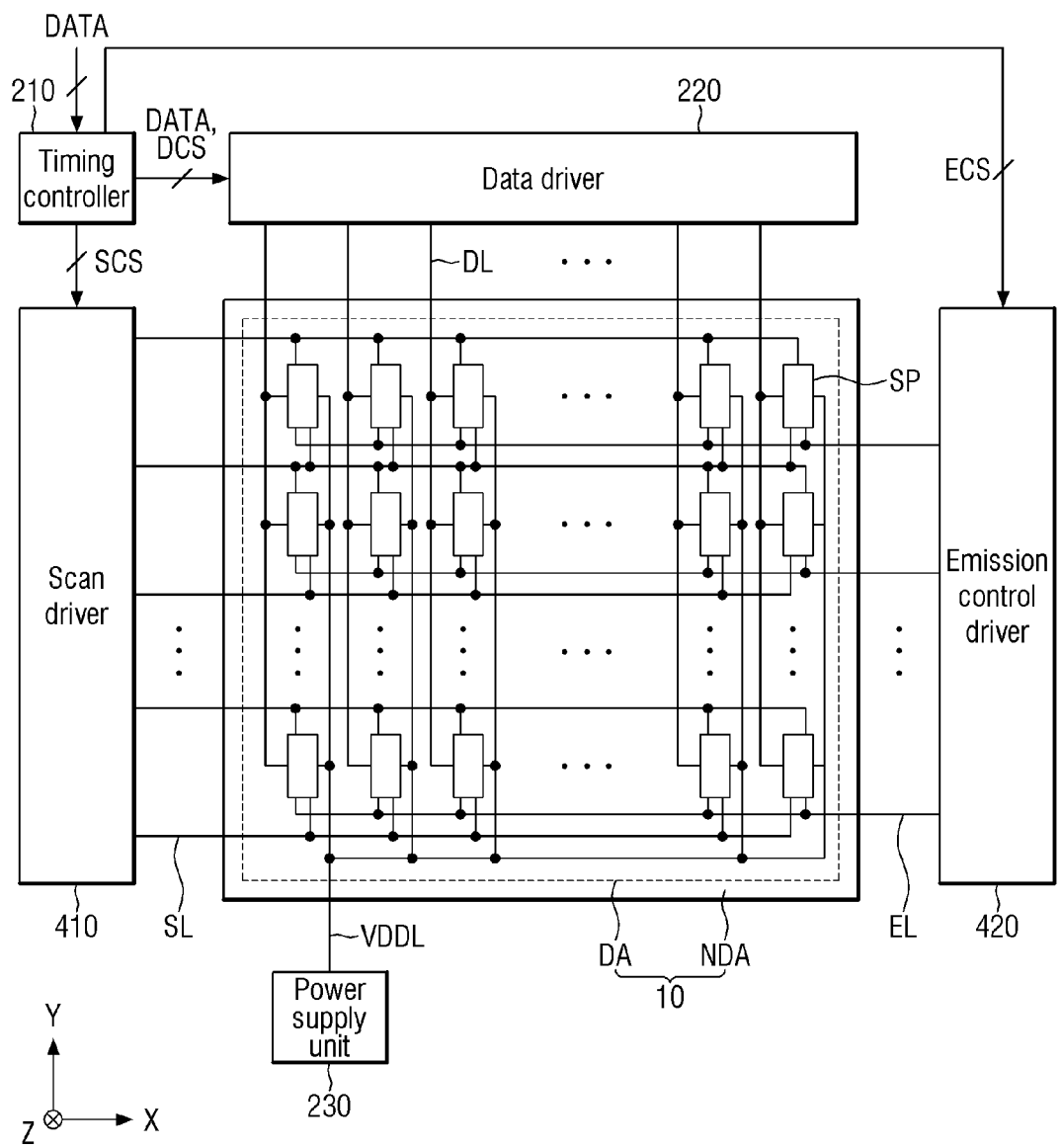
FIG. 3 is a block diagram showing a display device according to an exemplary embodiment of the present disclosure.

FIG. 1 is a perspective view showing a display device according to an exemplary embodiment of the present disclosure. FIG. 2 is a plan view showing a display device according to an exemplary embodiment of the present disclosure. FIG. 3 is a block diagram showing a display device according to an exemplary embodiment of the present disclosure.

As used herein, the terms "above," "top" and "upper surface" refer to the upper side of the display panel 100, i.e., the side indicated by the arrow in the z-axis direction, whereas the terms "below," "bottom" and "lower surface" refer to the lower side of the display panel 100, i.e., the opposite side in the z-axis direction. As used herein, the terms "left," "right," "upper" and "lower" sides indicate relative positions when the display panel 100 is viewed from the top. For example, the "left side" refers to the opposite side of the arrow of the x-axis direction, the "right side" refers to the side indicated by the arrow of the x-axis direction, the "upper side" refers to the side indicated by the arrow of the y-axis direction, and the "lower side" refers to the opposite side of the arrow of the y-axis direction.

Referring to FIGS. 1 to 3, a display device 10 is for displaying moving images or still images. The display device 1 may be used as the display screen of portable electronic devices such as a mobile phone, a smart phone, a tablet PC, a smart watch, a watch phone, a mobile communications terminal, an electronic notebook, an electronic book, a portable multimedia player ("PMP"), a navigation device and a ultra mobile PC ("UMPC"), as well as the display screen of various products such as a television, a notebook, a monitor, a billboard and the Internet of Things.

The display device 10 may be a light-emitting display device such as an organic light-emitting display device using organic light-emitting diodes, a quantum-dot light-emitting display device including quantum-dot light-emitting layer, an inorganic light-emitting display device including an inorganic semiconductor, and a micro light-emitting display device using micro light-emitting diodes ("LED"). In the following description, an organic light-emitting display device is described as an example of the display device 10. It is, however, to be understood that the present disclosure is not limited thereto.

The display device 10 includes a display panel 100, a display driving circuit 200 and a circuit board 300.

The display panel 100 may be formed in a rectangular plane having shorter sides in a first direction (x-axis direction) and longer sides in a second direction (y-axis direction) intersecting the first direction (x-axis direction). Each of the corners where the short side in the first direction (x-axis direction) meets the longer side in the second direction (y-axis direction) may be rounded with a predetermined curvature or may be a right angle. The shape of the display panel 100 when viewed from the top is not limited to a quadrangular shape, but may be formed in a different polygonal shape, a circular shape, or an elliptical shape. The display panel 100 may be, but is not limited to being, formed to be flat. The display panel 10 may include curved portions formed at left and right ends thereof and having a constant or varying curvature. In addition, the display panel 100 may be formed to be flexible so that it can be curved, bent, folded or rolled.

The display panel 100 may include a display area DA where sub-pixels SP are formed to display images, and a non-display area NDA which is the peripheral area of the display area DA. In the display area DA, the scan lines SL connected to the sub-pixels SP, emission control lines EL, data lines DL and first driving voltage lines VDDL may be disposed besides the sub-pixels SP. The scan lines SL and the emission control lines EL may be arranged in the first direction (x-axis direction), while the data lines DL may be arranged in the second direction (y-axis direction) intersecting the first direction (x-axis direction). The first driving voltage lines VDDL may be arranged in parallel in the second direction (y-axis direction) in the display area DA. The first driving voltage lines VDDL formed in parallel in the second direction (y-axis direction) in the display area DA may be disposed in the non-display area NDA.

Each of the sub-pixels SP may be connected to at least one of the scan lines SL, one of the data lines DL, at least one of the emission control lines EL, and the respective first drive voltage line VDDL. In the example shown in FIG. 2, each of the sub-pixels SP is connected to two scan lines SL, one data line DL, one emission control line EL and the first drive voltage line VDDL. It is, however, to be understood that the present disclosure is not limited thereto. For example, each of the sub-pixels SP may be connected to three scan lines SL rather than two scan lines SL.

Each of the sub-pixels SP may include a driving transistor, at least one transistor, a light-emitting element, and a capacitor. The transistor may be turned on in response to a scan signal from a scan line SL, so that the data voltage from the data line DL may be applied to the gate electrode of the driving transistor DT. When the data voltage is applied to the gate electrode, the driving transistor DT may supply a driving current to the light-emitting element, so that light can be emitted. The driving transistor DT and the at least one transistor ST may be thin-film transistors. The light-emitting element may emit light in accordance with the driving current from the driving transistor DT. The light-emitting element may be an organic light-emitting diode including a first electrode, an organic emissive layer, and a second electrode. The capacitor can keep the data voltage applied to the gate electrode of the driving transistor DT constant.

The non-display area NDA may be defined as the area from the outer side of the display area DA to the edge of the display panel 100. In the non-display area NDA, a scan driving circuit 400 for applying scan signals to the scan lines SL, fan-out lines FL between the data lines DL and the display driving circuit 200, and the pads DP connected to the display driving circuit 200 may be disposed. The display driving circuit 200 and the pads DP may be disposed at the edge on one side of the display panel 100. The pads DP may be disposed closer to the edge on the side of the display panel 100 than the display driving circuit 200 is.

The scan driving circuit 400 may be connected to the display driving circuit 200 through a plurality of scan control lines SCL. The scan driving circuit 400 may receive a scan control signal SCS and an emission control signal ECS from the display driving circuit 200 through the scan control lines SCL.

The scan driving circuit 400 may include a scan driver 410 and an emission control driver 420 as shown in FIG. 3.

The scan driver 410 may generate scan signals according to the scan control signal SCS and may sequentially output the scan signals to the scan lines SL. The emission control driver 420 may generate the emission control signals according to the emission control signal ECS and may sequentially output the emission control signals to the emission control lines EL.

The scan driving circuit 400 may include a plurality of thin-film transistors. The scan driving circuit 400 may be formed in the same layer as the thin-film transistors of the sub-pixels pixels SP. Although the scan driving circuit 400 is formed in the non-display area NDA on the both sides, i.e., on the right side and the left side of the display area DA in FIG. 2, the present disclosure is not limited thereto. For example, the scan driving circuit 400 may be formed in the non-display area NDA on one side, e.g., on the left side of the display area DA.

The display driving circuit 200 may include a timing controller 210, a data driver 220, and a power supply circuit 230 as shown in FIG. 3.

The timing controller 210 receives digital video data DATA and timing signals from the circuit board 300. The timing controller 210 may generate the scan control signal SCS for controlling the operation timing of the scan driver 410 according to the timing signals, may generate the emission control signal ECS for controlling the operation timing of the emission control driver 420 and may generate the data control signal DCS for controlling the operation timing of the data driver 220. The timing controller 210 may output the scan control signal SCS to the scan driver 410 through the scan control lines SCL and the emission control signal ECS to the emission control driver 420. The timing controller 210 may output the digital video data DATA and the data control signal DCS to the data driver 220.

The data driver 220 converts the digital video data DATA into analog positive/negative data voltages and supplies them to the data lines DL through the fan-out lines FL. Sub-pixels SP are selected by the scan signals of the scan driving circuit 400, and data voltages are supplied to the selected sub-pixels SP.

The power supply circuit 230 may generate a first driving voltage to supply it to the first driving voltage line VDDL. In addition, the power supply circuit 230 may generate a second driving voltage to supply it to the cathode electrodes of the organic light-emitting emitting diode of each of the sub-pixels SP. The first driving voltage may be a high-level voltage for driving the organic light-emitting diode, and the second driving voltage may be a low-level voltage for driving the organic light-emitting diode. That is to say, the first driving voltage may have a higher level than that of the second driving voltage.

The display driving circuit 200 may be implemented as an integrated circuit ("IC") and may be attached to the display panel 10 by a chip on glass ("COG") technique, a chip on plastic ("COP") technique, or an ultrasonic bonding. It is, however, to be understood that the present disclosure is not limited thereto. For example, the display driving circuit 200 may be attached to the circuit board 300.

The circuit board 300 may be attached to the pads DP using an anisotropic conductive film. In this manner, the lead lines of the circuit board 300 may be electrically connected to the pads DP. The circuit board 300 may be a flexible printed circuit board, a printed circuit board, or a flexible film such as a chip-on film.

Figure 4:
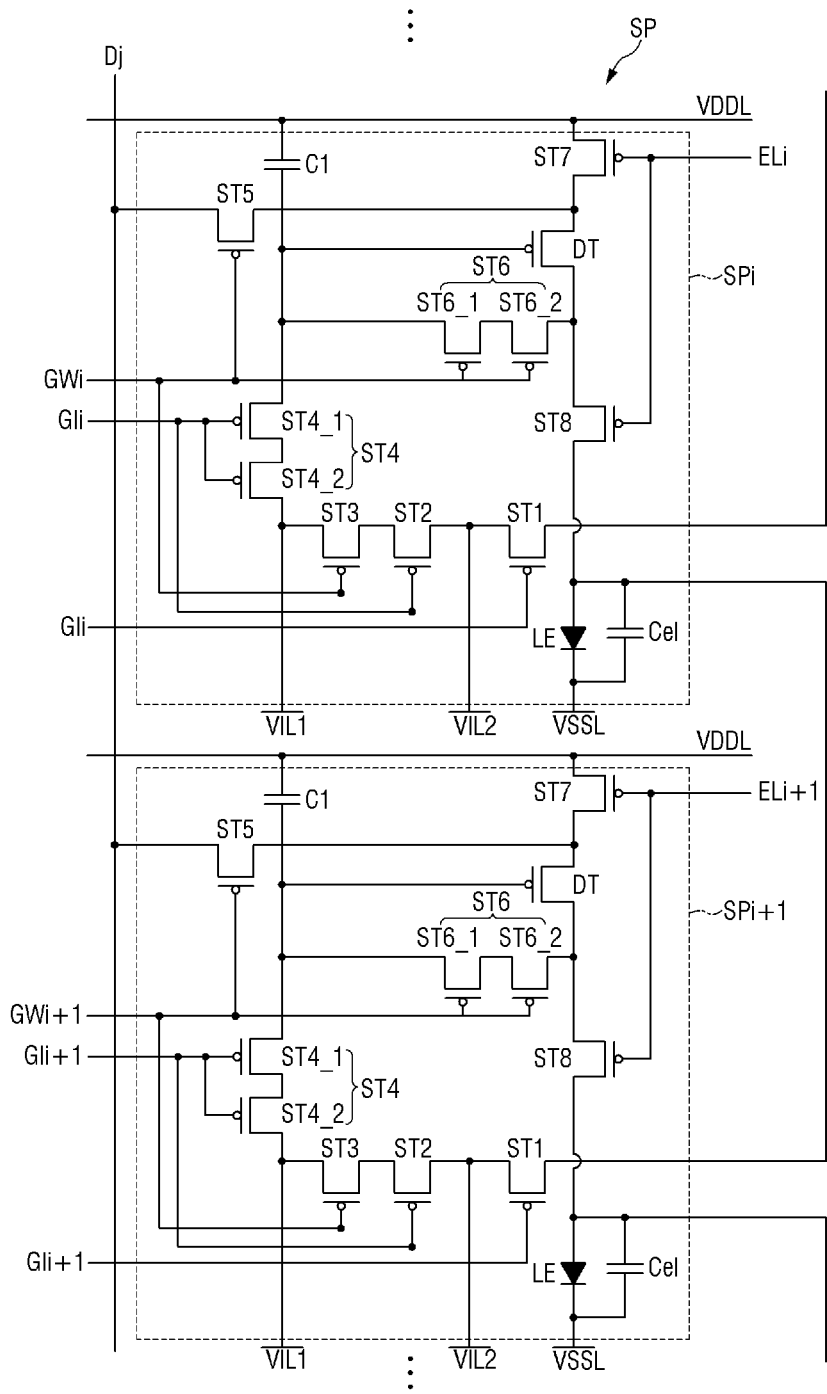
FIG. 4 is a circuit diagram showing a sub-pixel according to an exemplary embodiment of the present disclosure.

FIG. 4 is a circuit diagram showing a sub-pixel according to an exemplary embodiment of the present disclosure. In FIG. 4, sub-pixels SP are defined by dotted lines for convenience of illustration.

Each of the sub-pixels SP may be connected to a first scan line, a second scan line, an emission control line EL, and a data line DL. A scan signal applied to the first scan line of the sub-pixel SPi in i-th row may be identical to a scan signal applied to the second scan line of the sub-pixel SP(i−1) in the previous row.

In FIG. 4, the $i^{th}$ sub-pixel SPi refers to the sub-pixel disposed in the $i^{th}$ row, and the $(i+1)^{th}$ sub-pixel SP(i+1) refers to the sub-pixel SP disposed in the $(i+1)^{th}$ row. The $i^{th}$ sub-pixel SPi and the $(i+1)^{th}$ sub-pixel SP(i+1) may be arranged in the second direction (y-axis direction).

For example, referring to the sub-pixels SPi and SP(i+1) of FIG. 4, where i is an integer greater than or equal to two, the scan signal applied to the first scan line GI(i+1) of the (i+1)$^{th}$ sub-pixel SP(i+1) may be substantially identical to the scan signal applied to the second scan line GWi of the i$^{th}$ sub-pixel SPi.

In addition, each of the sub-pixels SP may be connected to a first driving voltage line VDDL from which the first driving voltage is supplied, a first initialization voltage line VIL1 from which a first initialization voltage Vini1 is supplied, a second initialization voltage line VIL2 from which a second initialization voltage Vint2 is supplied, and a second driving voltage line VSSL from which the second driving voltage is supplied.

Each of the sub-pixels SP includes a driving transistor DT, a light-emitting element LE, switch elements and a first capacitor C1. The switch elements may include first to eighth transistors ST1, ST2, ST3, ST4, ST5, ST6, ST7 and ST8.

According to an exemplary embodiment of the present disclosure, the first transistor ST1 of the sub-pixel SP may initialize the light-emitting element LE of the sub-pixel SP disposed in the previous row. For example, the first transistor ST1 of the (i+1)$^{th}$ sub-pixel SP(i+1) may be connected to the light-emitting element LE of the i$^{th}$ sub-pixel SPi. Accordingly, in order to initialize the light-emitting element LE of the i$^{th}$ sub-pixel SPi, the first transistor ST1 of the (i+1)$^{th}$ sub-pixel SP(i+1) should be turned on. In addition, as the first transistor ST1 of the i$^{th}$ sub-pixel SPi is connected to the second initialization voltage line VIL2 of the i$^{th}$ sub-pixel SPi and the light-emitting element LE of the (i−1)$^{th}$ sub-pixel SP(i−1), the first transistor ST1 of the i$^{th}$ sub-pixel SPi should be turned on in order to initialize the light-emitting element LE of the (i−1)$^{th}$ sub-pixel SP(i−1).

That is to say, in order to initialize the light-emitting element LE of the i$^{th}$ sub-pixel SPi, turning on of the first transistor ST1 of the (i+1)$^{th}$ sub-pixel SP(i+1) is required. To this end, in the following description on the driving of the i$^{th}$ sub-pixel SPi with reference to FIGS. 4 to 8, the first transistor ST1 refers to the first transistor ST1 of the (i+1)$^{th}$ sub-pixel SP(i+1), and the second to eighth transistors ST2, ST3, ST4, ST5, ST6, ST7 and ST8 and the light-emitting element LE refer to the second to eighth transistors ST2, ST3, ST4, ST5, ST6, ST7 and ST8 and the light-emitting element LE of the i$^{th}$ sub-pixel SPi, unless specifically stated otherwise.

The driving transistor DT may include a gate electrode DT_G, a first electrode DT_S and a second electrode DT_D. The gate electrode DT_G is agate electrode disposed above the active layer of the driving transistor DT.

The drain-source current Isd (hereinafter referred to as "driving current") of the driving transistor DT is controlled according to the data voltage applied to the gate electrode DT_G. The driving current Isd flowing through the channel of the driving transistor DT is proportional to the square of the difference between the gate-source voltage Vsg and the absolute value of the threshold voltage Vth of the driving transistor DT, as shown in Equation 1 below:

$$Isd = k' \times (Vsg - |Vth|)^2 \qquad \text{[Equation 1]}$$

where k' denotes a proportional coefficient determined by the structure and physical properties of the driving transistor, Vsg denotes the source-gate voltage of the driving transistor, and Vth denotes the threshold voltage of the driving transistor DT.

The light-emitting element LE emits light as the driving current Isd flows therein. The amount of the light emitted from the light-emitting element LE may be proportional to the driving current Isd.

The light-emitting element LE may be an organic light-emitting diode including an anode electrode, a cathode electrode, and an organic emissive layer disposed between the anode electrode and the cathode electrode. Alternatively, the light-emitting element LE may be an inorganic light-emitting element including an anode electrode, a cathode electrode, and an inorganic semiconductor disposed between the anode electrode and the cathode electrode. Alternatively, the light-emitting element LE may be a quantum-dot light-emitting element including an anode electrode, a cathode electrode, and a quantum-dot emissive layer disposed between the anode electrode and the cathode electrode. Alternatively, the light-emitting element LE may be a micro light-emitting diode.

The anode electrode of the light-emitting element LE may be connected to the second electrode of the first transistor ST1 and the first electrode of the eighth transistor ST8, while the cathode electrode of the light-emitting element LE may be connected to the second driving voltage line VSSL. A parasitic capacitance Cel may be formed between the anode electrode and the cathode electrode of the light-emitting element LE.

The first transistor ST1 may be disposed between the light-emitting element LE of the i$^{th}$ sub-pixel SPi and the second initialization voltage line VIL2 connected to the (i+1)$^{th}$ sub-pixel SP(i+1). The first transistor ST1 is turned on by a scan signal of the first scan line GI(i+1) connected to the (i+1)$^{th}$ sub-pixel SP(i+1), to connect the anode electrode of the light-emitting element LE of the i$^{th}$ sub-pixel SPi with the second initialization voltage line VIL2 connected to the (i+1)$^{th}$ sub-pixel SP(i+1). The anode electrode of the light-emitting element LE of the i$^{th}$ sub-pixel SPi may be discharged to the second initialization voltage Vint2. The gate electrode of the first transistor ST1 may be connected to the first scan line GI(i+1) connected to the (i+1)$^{th}$ sub-pixel SP(i+1), the first electrode of the first transistor ST1 may be connected to the second initialization voltage line VIL2 connected to the (i+1)$^{th}$ sub-pixel SP(i+1), and the second electrode of the first transistor ST1 may be connected to the anode electrode of the light-emitting element LE of the i$^{th}$ sub-pixel SPi.

In this instance, the scan signal applied to the first scan line GI(i+1) connected to the (i+1)$^{th}$ sub-pixel SP(i+1) may be substantially identical to the scan signal applied to the second scan line GWi connected to the i$^{th}$ sub-pixel SPi.

The second transistor ST2 may be turned on by a scan signal of the first scan line GIi. The second transistor ST2 may be disposed between the second initialization voltage line VIL2 and the third transistor ST3. The gate electrode of the second transistor ST2 may be connected to the first scan line GIi, the first electrode of the second transistor ST2 may be connected to the second electrode of the third transistor ST3, and the second electrode of the second transistor ST2 may be connected to the second initialization voltage line VIL2.

The third transistor ST3 may be disposed between the first initialization voltage line VIL1 and the second transistor ST2. The third transistor ST3 may be turned on by a scan signal of the second scan line GWi. The gate electrode of the third transistor ST3 may be connected to the s e scan line GWi, the first electrode of the third transistor ST3 may be connected to the first initialization voltage line VIL1, and the second electrode of the third transistor ST3 may be connected to the first electrode of the second transistor ST2.

If both the second transistor ST2 and the third transistor ST3 are turned on, there may be an issue that the first initialization voltage line VIL1 is connected to the second initialization voltage line VIL2. Therefore, by alternately applying a turn-on scan signal to the second transistor ST2 and the third transistor ST3 in an embodiment of the invention, it is possible to eliminate the issue that the second transistor ST2 and the third transistor ST3 are turned on simultaneously. For example, when the second transistor ST2 is turned on by the scan signal of the first scan line GIi, the third transistor ST3 may be turned off by the scan signal of the second scan line GWi (See the first time period t1 in FIG. 5). When the third transistor ST3 is turned on by the scan signal of the second scan line GWi, the second transistor ST2 may be turned off by the scan signal of the first scan line GIi (See the second time period t2 in FIG. 5). When the second transistor ST2 is turned off by the scan signal of the first scan line GIi, the third transistor ST3 may be turned off by the scan signal of the second scan line GWi (See the third time period t3 in FIG. 5). Accordingly, the first initialization voltage line VIL1 and the second initialization voltage line VIL2 may be electrically separated from each other by the embodiment of the invention.

The fourth transistor ST4 may be disposed between the first initialization voltage line VIL1 and the gate electrode of the driving transistor DT. The fourth transistor ST4 may be implemented as a dual transistor including a (4-1) transistor ST4-1 and a (4-2) transistor ST4-2. The (4-1) transistor ST4-1 and the (4-2) transistor ST4-2 are turned on by the scan signal of the first scan line GIi to connect the gate electrode of the drive transistor DT with the first initialization voltage line VIL1. The gate electrode of the driving transistor DT may be discharged to the first initialization voltage Vint1 of the first initialization voltage line VIL1. The gate electrode of the (4-1) transistor ST4-1 may be connected to the first scan line GIi, and the first electrode of the (4-1) transistor ST4-1 may be connected to the second electrode of the (4-2) transistor ST4-2. The second electrode of the (4-1) transistor ST4-1 may be connected to the gate electrode of the driving transistor DT. The gate electrode of the (4-2) transistor ST4-2 may be connected to the first scan line GIi, the first electrode of the (4-2) transistor ST4-2 may be connected to the first initialization voltage line VIL1, and the second electrode of the (4-2) transistor ST4-2 may be connected to the first electrode of the (4-1) transistor ST4-1.

The fifth transistor ST5 may be disposed between the $j^{th}$ data line Dj and the first electrode of the driving transistor DT. Here, j is a positive integer. The fifth transistor ST5 is turned on by the scan signal of the second scan line GWi to connect the first electrode of the driving transistor DT and the $j^{th}$ data line Dj. The gate electrode of the fifth transistor ST5 may be connected to the second scan line GWi, the first electrode of the fifth transistor ST5 may be connected to the data line Dj, and the second electrode of the fifth transistor ST5 may be connected to the first electrode of the driving transistor DT.

The sixth transistor ST6 may be disposed between the gate electrode of the driving transistor DT and the second electrode of the driving transistor DT. The sixth transistor ST6 may be implemented as a dual transistor including a (6-1) transistor ST6-1 and a (6-2) transistor ST6-2. The (6-1) transistor ST6-1 and the (6-2) transistor ST6-2 are turned on by the scan signal of the second scan line GWi, to connect the gate electrode of the driving transistor DT with and the second electrode of the driving transistor DT. That is to say, when the (6-1) transistor ST6-1 and the (6-2) transistor ST6-2 are turned on, the gate electrode and the second electrode of the driving transistor DT are connected, and thus the driving transistor DT may function like a diode. The gate electrode of the (6-1) transistor ST6-1 may be connected to the second scan line GWi, the first electrode of the (6-1) transistor ST6-1 may be connected to the second electrode of the (6-2) transistor ST6-2, and the second electrode of the (6-1) transistor ST6-1 may be connected to the gate electrode of the driving transistor DT. The gate electrode of the (6-2) transistor ST6-2 may be connected to the second scan line GWi, the first electrode of the (6-2) transistor ST6-2 may be connected to the second electrode of the drive transistor DT, and the second electrode of the (6-2) transistor ST6-2 may be connected to the first electrode of the (6-1) transistor ST6-1.

The seventh transistor ST7 may be disposed between the first driving voltage line VDDL and the first electrode of the driving transistor DT. The seventh transistor ST7 is turned on by the emission control signal of the $i^{th}$ emission control line ELi to connect the first electrode of the driving transistor DT with the first driving voltage line VDDL. The gate electrode of the seventh transistor ST7 is connected to the $i^{th}$ emission control line ELi, the first electrode of the seventh transistor ST7 is connected to the first electrode of the driving transistor DT, and the second electrode of the seventh transistor ST7 is connected to the first driving voltage line VDDL.

The eighth transistor ST8 may be disposed between the second electrode of the driving transistor DT and the anode electrode of the light-emitting element LE. The eighth transistor ST8 is turned on by the emission control signal of the $i^{th}$ emission line ELi to connect the second electrode of the driving transistor DT with the anode electrode of the light-emitting element LE. The gate electrode of the eighth transistor ST8 is connected to the $i^{th}$ emission control line ELi, the second electrode of the eighth transistor ST8 is connected to the second electrode of the driving transistor DT, and the first electrode of the eighth transistor ST8 is connected to the anode electrode of the light-emitting element LE. When the seventh transistor ST7 and the eighth transistor ST8 both are turned on, the driving current Isd can be supplied to the light-emitting element LE.

The capacitor C1 is formed between the gate electrode of the driving transistor DT and the first driving voltage line VDDL. One electrode of the capacitor C1 may be connected to the gate electrode of the driving transistor DT while the other electrode of the capacitor C1 may be connected to the first driving voltage line VDDL. Accordingly, the capacitor C1 can maintain a potential difference between the gate electrode of the driving transistor DT and the first driving voltage line VDDL.

When the first electrode of each of the first to eighth transistors ST1, ST2, ST3, ST4, ST5, ST6, ST7 and ST8 and the driving transistor DT is a source electrode, the second electrode thereof may be a drain electrode. Alternatively, when the first electrode of each of the first to eighth transistors ST1, ST2, ST3, ST4, ST5, ST6, ST7 and ST8 and the driving transistor DT is a drain electrode, the second electrode thereof may be a source electrode.

The active layer of each of the first to eighth transistors ST1, ST2, ST3, ST4, ST5, ST6, ST7 and ST8 and the driving transistor DT may be made of one of poly silicon, amorphous silicon and oxide semiconductor. When the semiconductor layer of each of the first to eighth transistors ST1, ST2, ST3, ST4, ST5, ST6, ST7 and ST8 and the driving transistor DT is made of poly silicon, a low-temperature poly silicon ("LTPS") process may be employed.

Although the first to eighth transistors ST1, ST2, ST3, ST4, ST5, ST6, ST7 and ST8 and the driving transistor DT are of p-type metal oxide semiconductor field effect transistors ("MOSFETs"), this is merely illustrative. At least one of the first to eighth transistors ST1, ST2, ST3, ST4, ST5, ST6, ST7 and ST8 and the driving transistor DT may be of an n-type MOSFET in another embodiment. When at least one of the first to sixth transistors ST1, ST2, ST3, ST4, ST5, ST6, ST7 and ST8 and the driving transistor DT is of an n-type MOSFET, the timing diagram of FIG. 5 should be modified appropriately for the characteristics of the n-type MOSFETs.

The first driving voltage from the first driving voltage line VDDL, the second driving voltage from the second driving voltage line VSSL, the first initialization voltage Vint1 from the first initialization voltage line VIL1, and the second initialization voltage Vint2 from the second initialization voltage line VIL2 may be determined based on the characteristics of the driving transistor DT, the characteristics of the light-emitting element LE, etc. For example, the voltage difference between the first initialization voltage Vint1 and the data voltage supplied to the source electrode of the driving transistor DT may be set to be smaller than the threshold voltage of the driving transistor DT. In addition, the magnitude of the second initialization voltage Vint2 may be different from the magnitude of the first initialization voltage Vint1.

Figure 5:
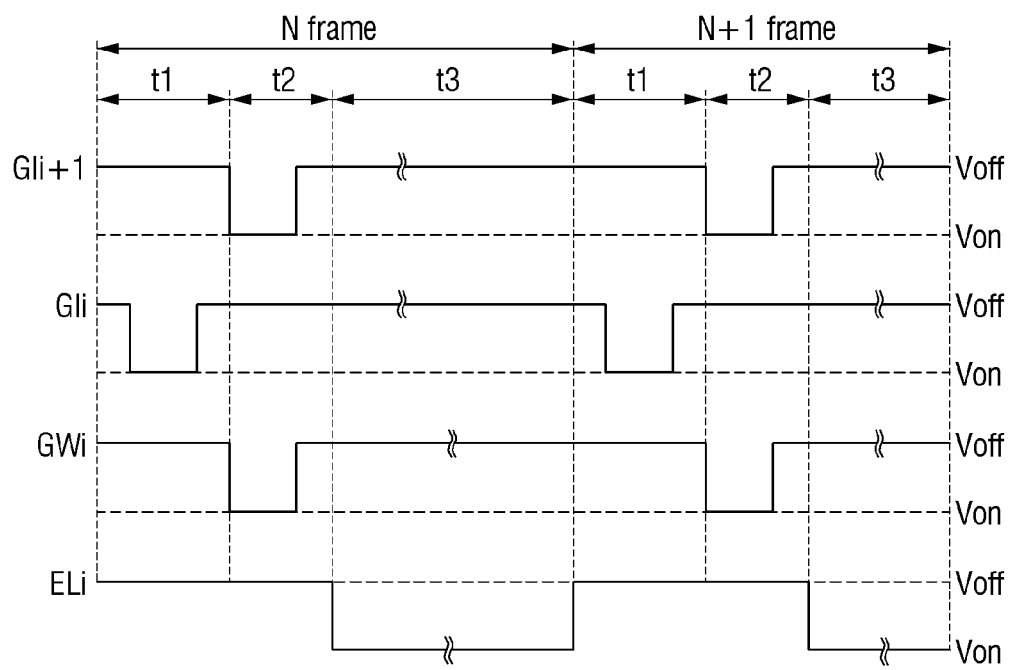
FIG. 5 is a waveform diagram showing signals applied to the first scan line, the second scan line and the $i^{th}$ emission control line connected to the $i^{th}$ sub-pixel, and the first scan line connected to the $(i+1)^{th}$ sub-pixel of FIG. 4.

FIG. 5 is a waveform diagram showing signals applied to the first scan line, the second scan line and the $i^{th}$ emission control line connected to the $i^{th}$ sub-pixel, and the first scan line connected to the $(i+1)^{th}$ sub-pixel of FIG. 4.

Referring to FIG. 5, a scan signal applied to a first scan line GIi connected to the $i^{th}$ sub-pixel SPi is a signal to turn on and off each of the second transistor ST2 and the fourth transistor ST4. A scan signal applied to a second scan line GWi connected to the $i^{th}$ sub-pixel SPi is a signal to turn on and off each of the third transistor ST3, the fifth transistor ST5 and the sixth transistor ST6. A scan signal applied to the first scan line GI(i+1) connected to the $(i+1)^{th}$ sub-pixel SP(i+1) is a scan signal to turn on and off the first transistor ST1 of the $(i+1)^{th}$ sub-pixel SP(i+1). The emission signal applied to the $i^{th}$ emission line ELi connected to the $i^{th}$ sub-pixel SPi is a signal for controlling the seventh transistor ST7 and the eighth transistor ST8.

Scan signals applied to the first scan line GIi and the second scan line GWi connected to the $i^{th}$ sub-pixel SPi, and to the first scan line GI(i+1) connected to the $(i+1)^{th}$ sub-pixel SP(i+1) may be generated every one frame. The emission signal applied to the $i^{th}$ emission control line ELi may be generated every frame. One frame may be divided into a first time period t1, a second time period t2 and a third time period t3.

During the first time period t1, a first initialization voltage Vint1 is applied to the gate electrode DT_G of the driving transistor DT, so that the voltage at the gate electrode DT_G of the driving transistor DT is initialized to the first initialization voltage Vint1.

During the second time period t2, the data voltage Vdata is applied to the first electrode of the driving transistor DT, the threshold voltage Vth of the driving transistor DT is sampled, and the second initialization voltage Vint2 is applied to the anode electrode of the light-emitting element LE so that the voltage at the anode electrode of the light-emitting element LE is initialized to the second initialization voltage Vint2.

During the third time period t3, the driving current Isd flowing according to the voltage at the gate electrode DT_G of the driving transistor DT is supplied to the light-emitting element LE so that the light-emitting element LE emits light.

The scan signal applied to the first scan line GIi connected to the $i^{th}$ sub-pixel SPi may have the gate-on voltage Von during the first time period t1 and the gate-off voltage Voff during the other time periods.

The scan signal applied to the second scan line GWi connected to the $i^{th}$ sub-pixel SPi may have the gate-on voltage Von during the second time period t2 and the gate-off voltage Voff during the other time periods.

The emission signal applied to the $i^{th}$ emission control line ELi connected to the $i^{th}$ sub-pixel SPi may have the gate-on voltage Von during the third time period t3 and the gate-off voltage Voff during the other time periods.

The scan signal applied to the first scan line GI(i+1) connected to the $(i+1)^{th}$ sub-pixel SPi may have the gate-on voltage Von during the second time period t2 and the gate-off voltage Voff during the other time periods.

Although the period in which the scan signal applied to the first scan line GIi connected to the $i^{th}$ sub-pixel SPi has the gate-on voltage Von is shorter than the first time period t1 in the example shown in FIG. 5, the period may be substantially equal to the first time period t1.

Although the period in which the scan signal applied to each of the second scan line GWi connected to the $i^{th}$ sub-pixel SPi and the first scan line GI(i+1) connected to the $(i+1)^{th}$ sub-pixel SP(i+1) has the gate-on voltage Von is shorter than the second time period t2 in the example shown in FIG. 5, the period may be substantially equal to the second time period t2.

Although the emission control signal applied to the $i^{th}$ emission control line ELi connected to the $i^{th}$ sub-pixel SPi has the gate-on voltage Von during the third time period t3 in the example shown in FIG. 5, the present disclosure is not limited thereto For example, the third time period t3 may include a plurality of first subsidiary time periods in which the emission control signal applied to the $i^{th}$ emission control line ELi connected to the $i^{th}$ sub-pixel SPi has the gate-on voltage Von, and a plurality of second subsidiary time periods in which the emission control signal has the gate-off voltage Voff. The plurality of first subsidiary time periods and the plurality of second subsidiary time periods may alternate with each other.

In the graph shown in FIG. 5, each of the first time period t1 and the second time period t2 is one horizontal period. One horizontal period refers to a period during which a data voltage is applied to each of the sub-pixels SP connected to a scan line of the display panel 100, and thus it may be defined as one horizontal line scan period. The data voltages may be applied to the data lines DL in synchronization with the gate-on voltage Von of each of the scan signals.

The gate-on voltage Von corresponds to a turn-on voltage that can turn on each of the first to eighth transistors ST1, ST2, ST3, ST4, ST5, ST6, ST7 and ST8. The gate-off voltage Voff corresponds to a turn-off voltage that can turn off each of the first to eighth transistors ST1, ST2, ST3, ST4, ST5, ST6, ST7 and ST8.

In the graph shown in FIG. 5, one frame includes a first time period t1, a second time period t2 and a third time period t3. It is, however, to be understood that the present disclosure is not limited thereto. For example, one frame may include two or more first time periods t1 and two or more second time periods t2. In such case, the first time periods t1 and the second time periods t2 may be arranged alternately and repeatedly, and the number of first time periods t1 may be substantially equal to the number of second time periods t2.

Figure 6:
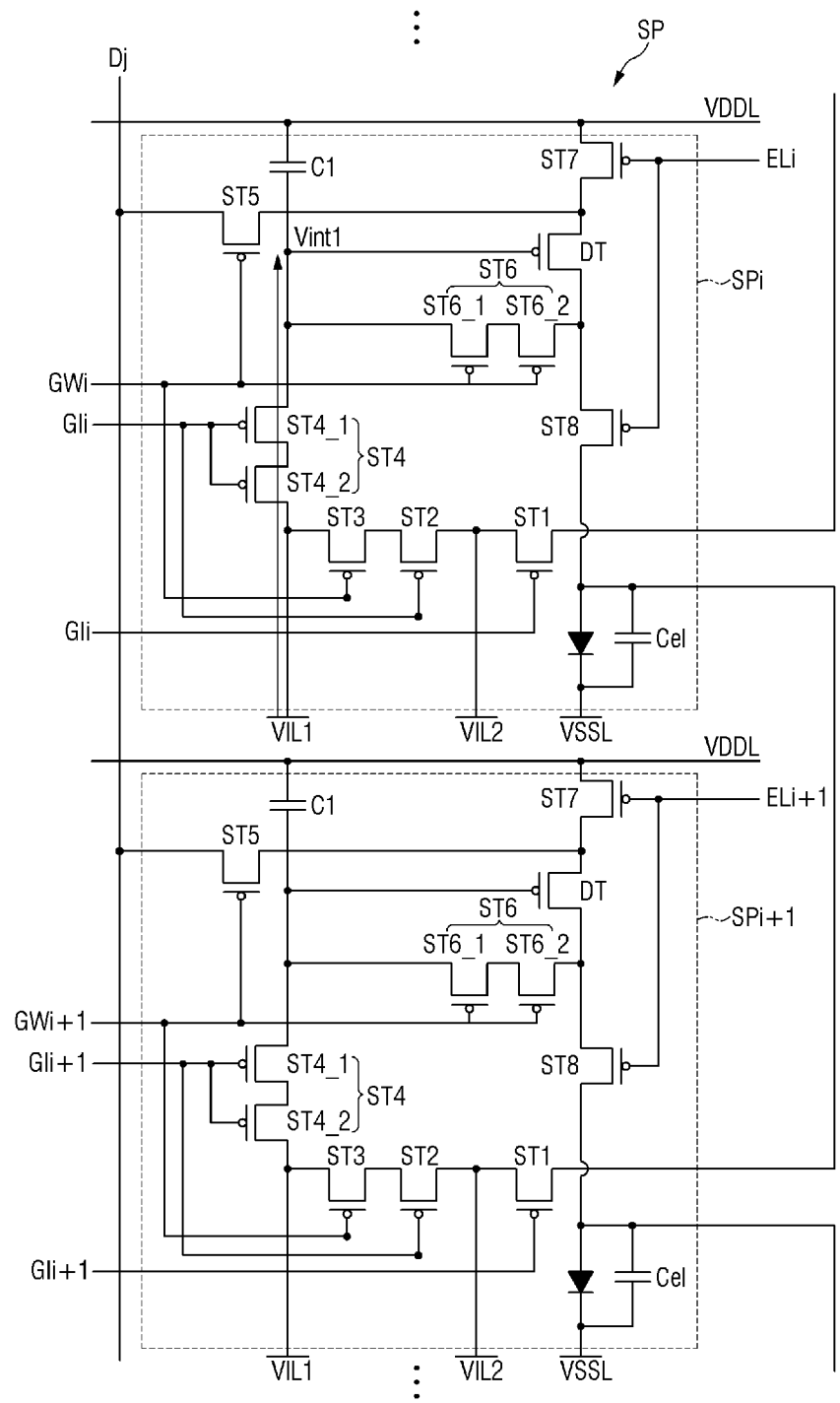
FIGS. 6 to 8 are circuit diagrams for illustrating a method of driving a driving transistor, second to eighth transistors and a light-emitting element of the $i^{th}$ sub-pixel, and a first transistor of the $(i+1)^{th}$ sub-pixel during the $N^{th}$ frame of FIG. 5.
Figure 7:
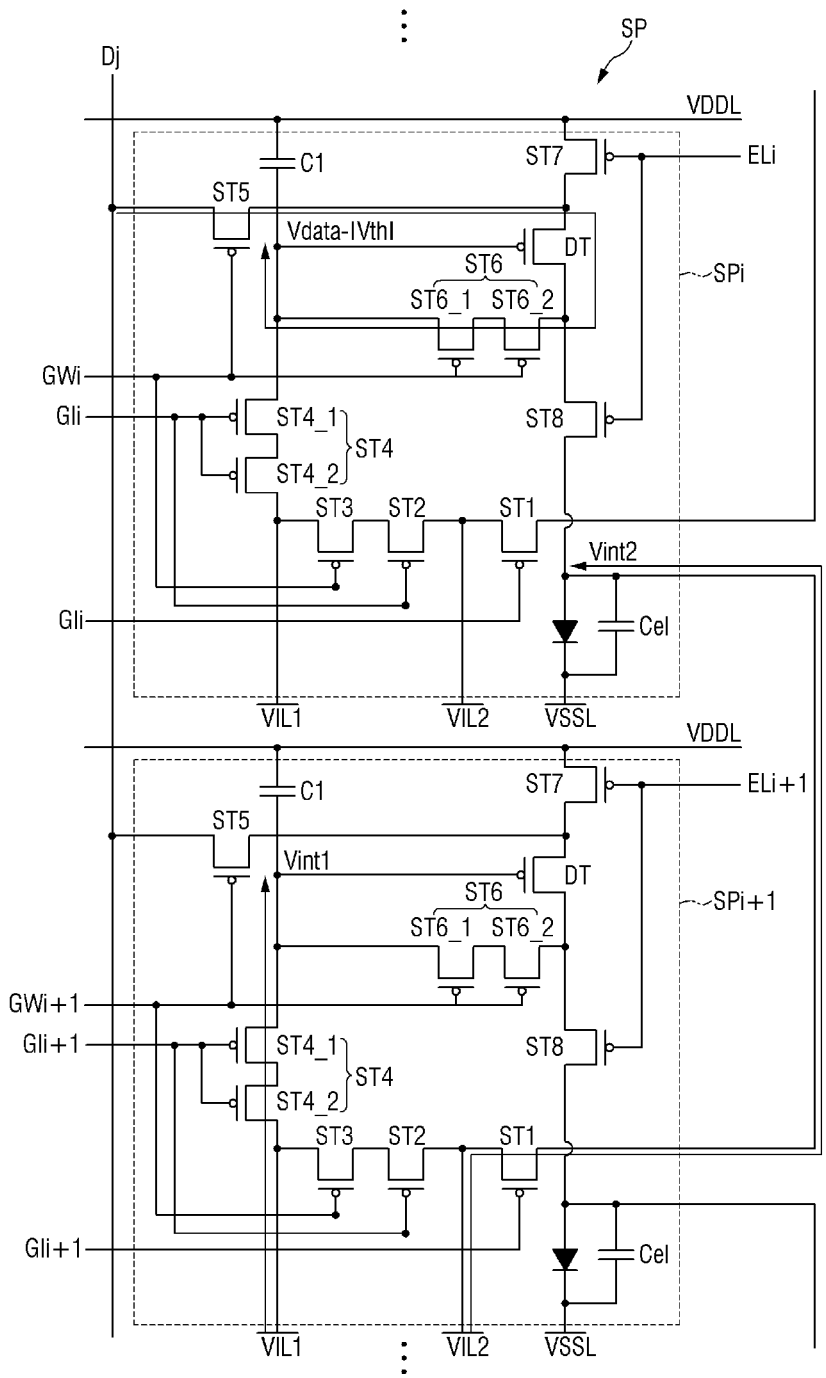
Figure 8:
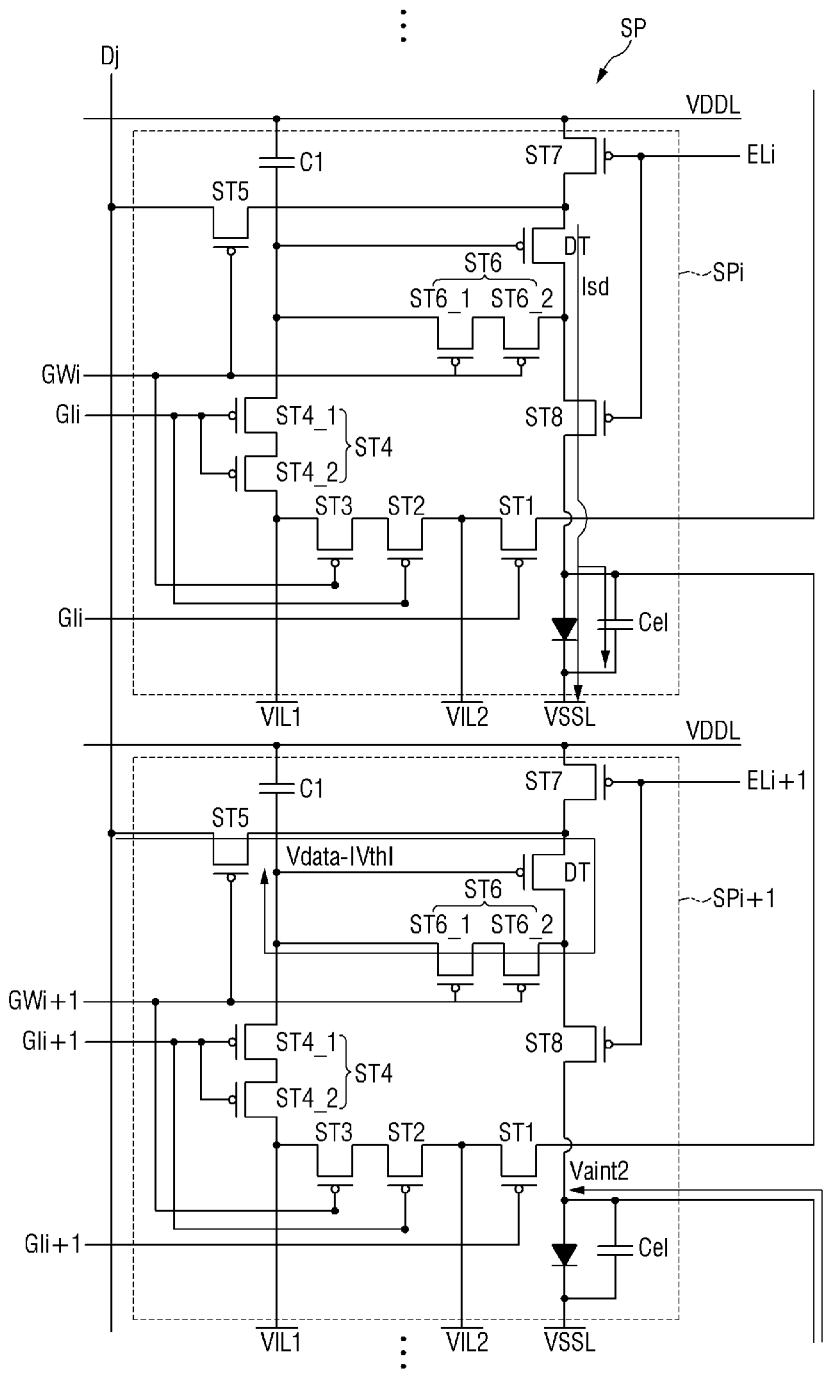

FIGS. 6 to 8 are circuit diagrams for illustrating a method of driving a driving transistor, second to eighth transistors and a light-emitting element of the $i^{th}$ sub-pixel, and a first transistor of the $(i+1)^{th}$ sub-pixel during the $N^{th}$ frame of FIG. 5.

Hereinafter, the operations of the driving transistor DT, the second to eighth transistors ST2, ST3, ST4, ST5, ST6, ST7 and ST8 and the light-emitting element LE of the $i^{th}$ sub-pixel SPi, and the first transistor ST1 of the $(i+1)^{th}$ sub-pixel SP(i+1) during the $N^{th}$ frame of FIG. 5 will be described in detail.

First, during the first time period t1, a scan signal having the gate-on voltage Von is supplied to a first scan line GIi connected to the $i^{th}$ sub-pixel SPi. During the first time period t1, as shown in FIG. 6, each of the second transistor ST2 and the fourth transistor ST4 is turned on by the gate-on voltage Von applied to the first scan line GIi connected to the first sub-pixel SPi. As the fourth transistor ST4 is turned on, the gate electrode of the driving transistor DT is initialized to the first initialization voltage Vint1 of the first initialization voltage line VIL1.

Although the second transistor ST2 is turned on during the first time period t1, the third transistor ST3 is turned off, so that the first initialization voltage line VIL1 and the second initialization voltage line VIL2 are electrically separated from one another.

Second, during the second time period t2, a scan signal having the gate-on voltage Von is supplied to the second scan line GWi connected to the $i^{th}$ sub-pixel SPi and the first scan line GI(i+1) connected to the $(i+1)^{th}$ sub-pixel SP(i+1). During the second time period t2, as shown in FIG. 7, the first transistor ST1 is turned on by the gate-on voltage Von applied to the first scan line GI(i+1) connected to the $(i+1)^{th}$ sub-pixel SP(i+1). Each of the third transistor ST3, the fifth transistor ST5 and the sixth transistor ST6 is turned on by the gate-on voltage Von applied to the second scan line GWi connected to the first sub-pixel SPi.

Although the third transistor ST2 is turned on during the second time period t2, the second transistor ST2 is turned off, so that the first initialization voltage line VIL1 and the second initialization voltage line VIL2 are electrically separated from one another.

As the first transistor ST1 of the $(i+1)^{th}$ sub-pixel SP(i+1) is turned on, the anode electrode of the light-emitting element LE of the $i^{th}$ sub-pixel SPi is initialized to the second initialization voltage Vint2 of the second initialization voltage line VIL2.

As the sixth transistor ST6 is turned on, the gate electrode and the second electrode of the driving transistor DT are connected to each other, such that the driving transistor DT works as a diode. As the fifth transistor ST5 is turned on, the data voltage Vdata is applied to the first electrode of the driving transistor DT. At this time, since the voltage between the first electrode and the gate electrode of the driving transistor DT (Vsg=Vdata−Vint1) is smaller than the absolute value of the threshold voltage Vth, the driving transistor DT forms a current path until the voltage Vsg between the gate electrode and the source electrode reaches the absolute value of the threshold voltage Vth. Accordingly, the gate electrode and the second electrode of the driving transistor DT increases up to the voltage difference (Vdata−|Vth|) between the data voltage Vdata and the absolute value of the threshold voltage Vth of the driving transistor DT during the second time period t2. The voltage equal to the voltage difference Vdata−|Vth| may be stored in the capacitor C1.

Since the driving transistor DT is a p-type MOSFET, the driving current Isd of the driving transistor DT may be proportional to the voltage Vsd between the source electrode and the drain electrode of the driving transistor DT during a period in which the voltage Vsd between the source electrode and the drain electrode of the driving transistor DT is greater than 0 V. In addition, since the driving transistor DT is implemented as a p-type MOSFET, the threshold voltage Vth may be less than 0V.

Third, an emission signal having the gate-on voltage Von is applied to the $i^{th}$ emission control line ELi connected to the $i^{th}$ sub-pixel SPi during the third time period t3. During the third time period t3, each of seventh transistor ST7 and the eighth transistor ST8 is turned on by the emission signal having the gate-on voltage Von, as shown in FIG. 8.

For reference, the third time period t3 of the $N^{th}$ frame of the $i^{th}$ sub-pixel SPi may be overlap with a part of the second time period t2 and the third time period t3 in the $N^{th}$ frame of the $(i+1)^{th}$ sub-pixel SP(i+1). FIG. 8 is a circuit diagram showing the operation of the $i^{th}$ sub-pixel SPi during the third time period t3 of the $N^{th}$ frame and the operation of the $(i+1)^{th}$ sub-pixel SP(i+1) during the second time period of the $N^{th}$ frame.

As the seventh transistor ST7 is turned on, the first electrode of the driving transistor DT is connected to the first driving voltage line VDDL. As the eighth transistor ST8 is turned on, the second electrode of the driving transistor DT is connected to the anode electrode of the light-emitting element LE.

When the seventh transistor ST7 and the eighth transistor ST8 are turned on, the driving current Isd can be supplied to the light-emitting element LE according to the voltage at the gate electrode of the driving transistor DT. The driving current Isd may be defined as shown in Equation 2 below:

$$Isd=k'\times(ELVDD-(Vdata-|Vth|)-|Vth|)^2 \quad \text{[Equation 2]}$$

where k' denotes a proportional coefficient determined by the structure and physical properties of the driving transistor, Vth denotes the threshold voltage of the driving transistor, and ELVDD denotes the first driving voltage from the first driving voltage line VDDL, and Vdata denotes the data voltage. The gate voltage of the driving transistor DT is equal to Vdata−Vth, and the voltage at the first electrode is equal to ELVDD. By summarizing Equation 2, Equation 3 below is derived.

$$Isd=k'\times(ELVDD-Vdata)^2 \quad \text{[Equation 3]}$$

Consequently, the driving current Isd does not depend on the threshold voltage Vth of the driving transistor DT as in Equation 3. That is to say, the threshold voltage Vth of the driving transistor DT is compensated.

During the third time period t3, the second transistor ST2 as well as the third transistor ST3 are turned off, so that the first initialization voltage line VIL1 and the second initialization voltage line VIL2 are electrically separated from each other.

As shown in FIG. 4, by adding the second transistor ST2 and the third transistor ST3 between the first transistor ST1 and the fourth transistor ST4 of the $i^{th}$ sub-pixel SPi, the active layer of the first transistor ST1 can be connected to the active layer of the fourth transistor ST4 of the $i^{th}$ sub-pixel SPi without being disconnected, which will be described later with reference to FIG. 9. Accordingly, the active layer of a sub-pixel may be connected to the active layers of the adjacent sub-pixels SP in the second direction (y-axis direction). In other words, the active layers of the sub-pixels SP may be formed integrally. Therefore, when static electricity is applied to the active layer during the fabricating process, a path for discharging static electricity is formed by the active layers of the adjacent sub-pixels SP in the second direction (y-axis direction) so that the static electricity can be discharged to the outside or dispersed. Therefore, it is possible to prevent the active layer from being burnt and damaged by the static electricity during the process If the second transistor ST2 and the third transistor ST3 are turned on simultaneously during the first time period t1 to the third time period, there may be formed a short circuit between the first initialization voltage line VIL1 and the second initialization voltage line VIL2. Therefore, in order to prevent a short circuit from being formed between the first initialization voltage line VIL1 and the second initialization voltage line VIL2, the second transistor ST2 and the third transistor ST3 are controlled so that they are not turned on simultaneously. As a result, the first initialization voltage line VIL1 and the second initialization voltage line VIL2 can be electrically separated from each other during the first period t1 to the third period t3, that is, the entire periods t1 to t3. Therefore, the first initialization voltage Vint1 applied to the gate electrode of the driving transistor DT and the second initialization voltage Vint2 applied to the anode electrode of the light emitting element EL can be uniformly applied without affecting each other.

Figure 9:
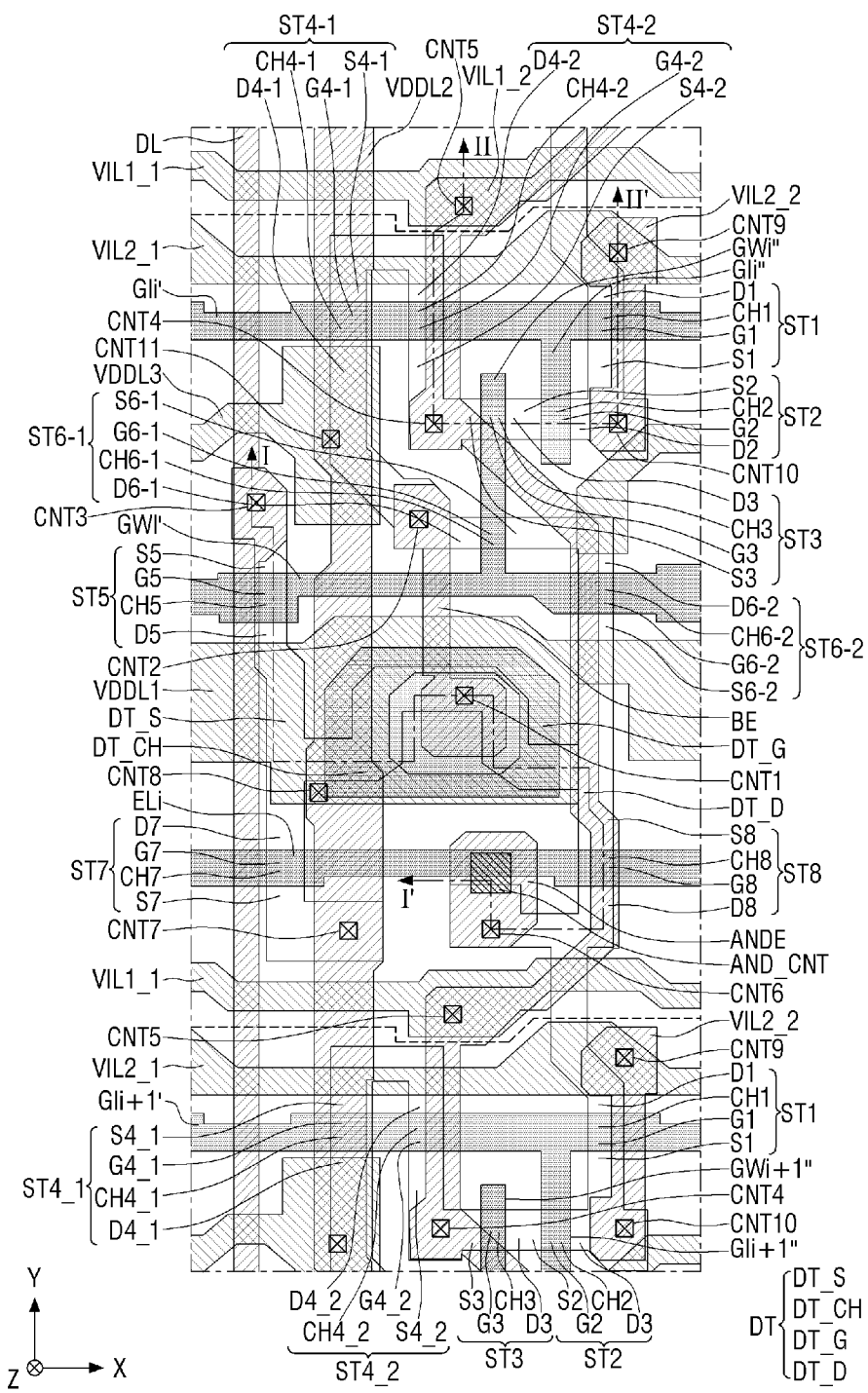
FIG. 9 is a plan view showing a sub-pixel according to an exemplary embodiment of the present disclosure.
Figure 10:
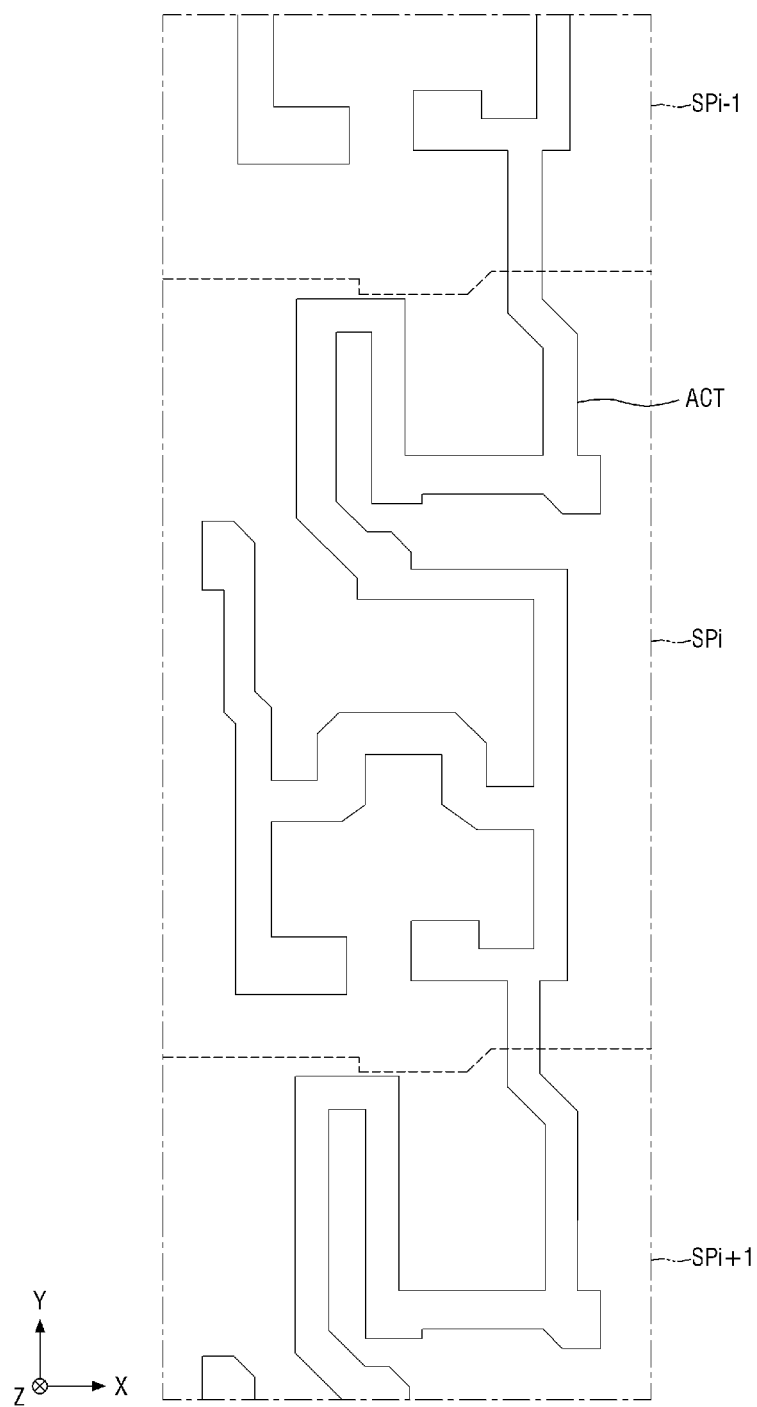
FIG. 10 is a plan view showing the active layer the sub-pixel of FIG. 9.
Figure 11:
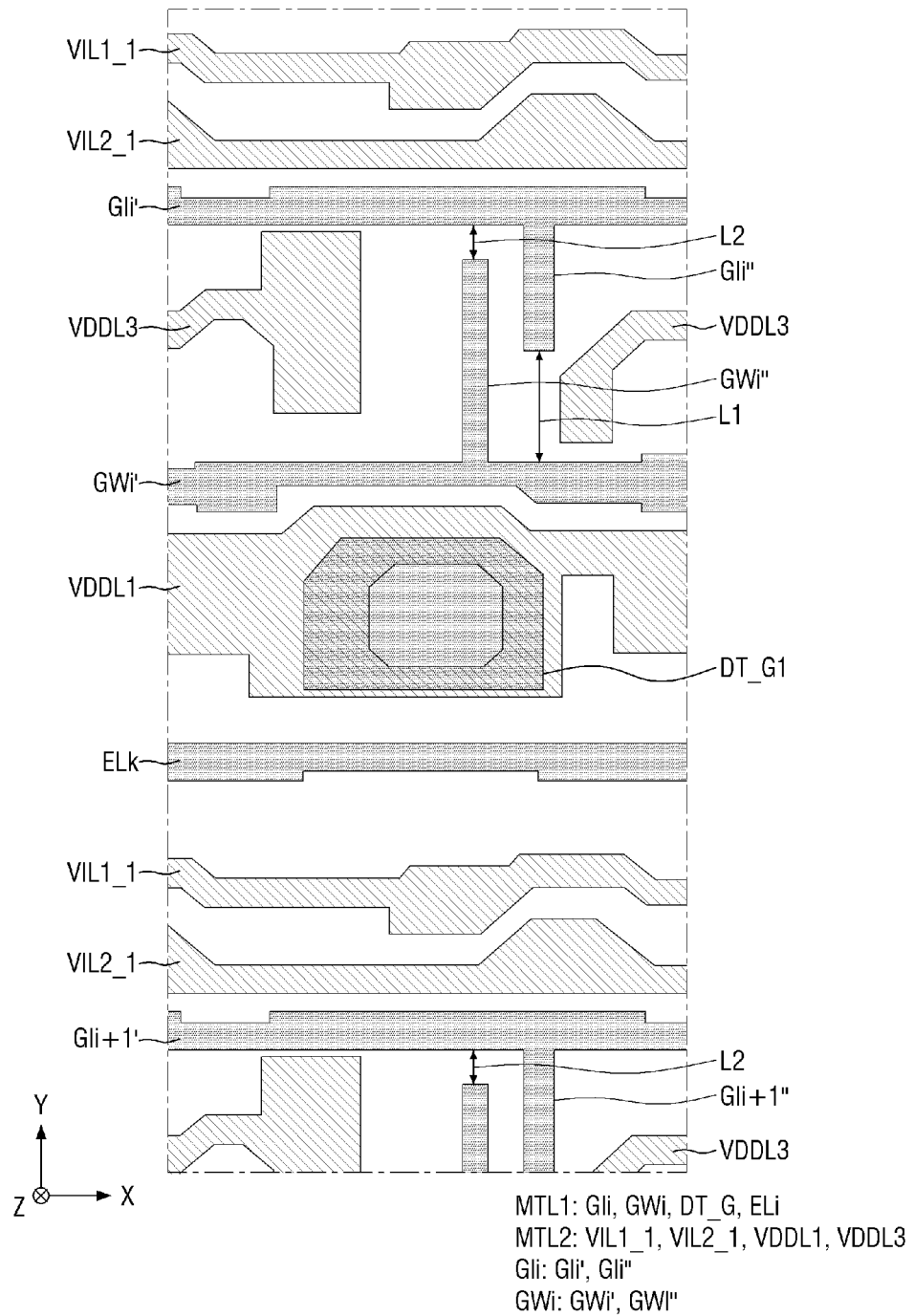
FIG. 11 is a plan view showing a first metal layer and a second metal layer of the sub-pixel of FIG. 9.
Figure 12:
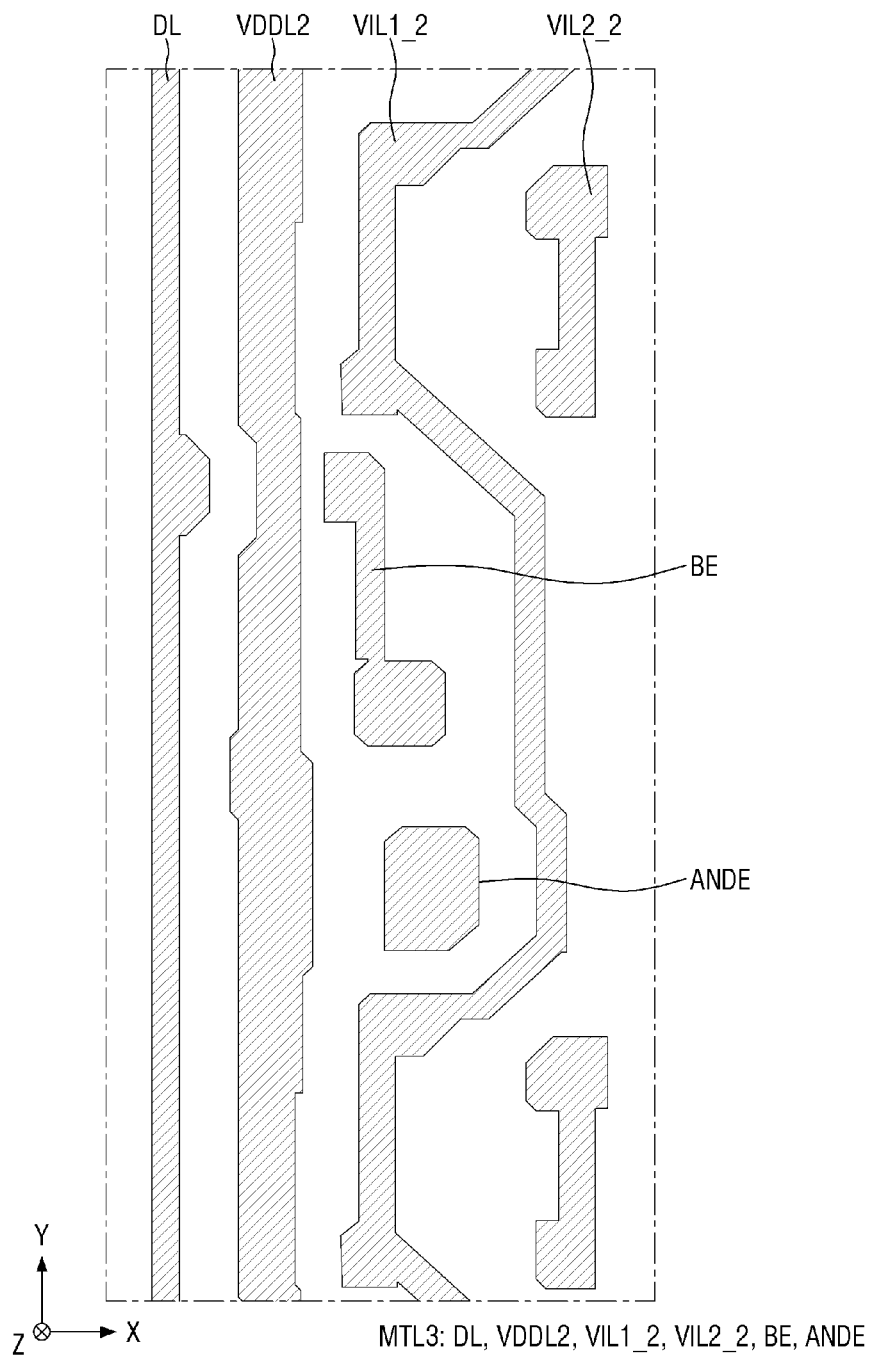
FIG. 12 is a plan view illustrating a third metal layer of the sub-pixel of FIG. 9.

FIG. 9 is a plan view showing a sub-pixel according to an exemplary embodiment of the present disclosure. FIG. 10 is a plan view showing the active layer the sub-pixel of FIG. 9. FIG. 11 is a plan view showing a first metal layer and a second metal layer of the sub-pixel of FIG. 9. FIG. 12 is a plan view illustrating a third metal layer of the sub-pixel of FIG. 9.

Referring to FIGS. 9 to 12, each of the sub-pixels SP may include a driving transistor DT, first to eighth transistors ST1, ST2, ST3, ST4, ST5, ST6, ST7 and ST8, and a capacitor C1. In addition, a plurality of sub-pixels SP(i−1), SPi and SP(i+1) adjacent to one another in the second direction (y-axis direction) may be divided as indicated by the dotted lines in FIG. 10.

Hereinafter, the driving transistor DT, the first to eighth transistors ST1, ST2, ST3, ST4, ST5, ST6, ST7 and ST8, and the capacitor C1 of the $i^{th}$ sub-pixel SPi formed by the active layer ACT and the first to third metal layers MTL1, MTL2 and MTL3 will be described with reference to FIGS. 9 to 12.

The active layer ACT may include channel regions CH1 to CH8, first electrodes S1 to S8 and second electrodes D1 to D8 of the first to eighth transistors ST1 to ST8, respectively.

The active layer ACT of each of the sub-pixels SP(i−1), SPi and SP(i+1) adjacent to one another in the second direction (y-axis direction) may be formed integrally as shown in FIG. 10. The first metal layer MTL1 may include a first scan line GIi, a second scan line GWi, a gate electrode DT_G of the driving transistor DT, and the $i^{th}$ emission control line ELi. The first scan line GIi, the second scan line GWi and the $i^{th}$ emission control line ELi may be extended in the first direction (x-axis direction).

The first scan line GIi may include a first extension GIi' extended in the first direction (x-axis direction), and a first protrusion GIi" protruding in the direction opposite to the second direction (y-axis direction). The second scan line GWi may include a second extension GWi' extended in the first direction (x-axis direction), and a second protrusion GWi" protruding in the second direction (y-axis direction).

The first extension GIi' and the second extension portion GWi' may be arranged parallel to each other and may overlap each other in the second direction (y-axis direction). The first protrusion GIi" and the second protrusion GWi" may be arranged parallel to each other and may overlap each other in the first direction (x-axis direction).

A first length L1 between the first protrusion GIi' and the second extension GWi' in the second direction (y-axis direction) may be different from a second length L2 between and the second protrusion GWi" and the first extension GIi' in the second direction (y-axis direction). For example, the first length L1 may be larger than the second length L2.

The first protrusion GIi" and the second protrusion GWi" may overlap with the active layer ACT in the third direction (z-axis direction). The active layer ACT may cross the first protrusion GIi" of the first scan line GIi, and the active layer ACT may cross the second protrusion GWi" of the second scan line GWi.

A part of the active layer ACT overlapping the first protrusion GIi" may be defined as the channel region CH2 of the second transistor ST2 in a plan view. A part of the active layer ACT overlapping the second protrusion GWi" may be defined as the channel region CH3 of the third transistor ST3 in a plan view. Between the channel region CH2 of the second transistor ST2 and the channel region CH3 of the third transistor ST3, the first electrode S2 of the second transistor ST2 and the second electrode D3 of the third transistor ST3 may be disposed.

The active layer ACT overlapping the first protrusion GI" and the active layer ACT overlapping the second protrusion GWi" may overlap each other in the first direction (x-axis direction).

The second protrusion GWi" may overlap with a first initialization voltage connection line VIL1_2, which will be described later, in the third direction (z-axis direction), and the first protrusion GIi" may not overlap with the first initialization voltage connection line VIL1_2 in the third direction (z-axis direction). The channel region CH3 of the third transistor ST3 may overlap with the first initialization voltage connection line VIL1_2 in the third direction (z-axis direction).

The first scan line GIi, the second scan line GWi and the $i^{th}$ emission control line ELi are sequentially arranged in the direction opposite to the second direction (y-axis direction), and FIG. 9 shows the $i^{th}$ sub-pixel SPi, i.e., the sub-pixel in the $i^{th}$ row. The gate electrode DT_G of the driving transistor DT may be disposed between the second scan line GWi and the $i^{th}$ emission control line ELi.

The second metal layer may include a first initialization voltage line VIL1_1, a second initialization voltage line VIL2_1, a (1-1) driving voltage line VDDL1, and a (1-3) driving voltage line VDDL3. The first initialization voltage line VIL1_1, the second initialization voltage line VIL2_1, the (1-1) driving voltage line VDDL1 and the (1-3) driving voltage line VDDL3 may be extended in the first direction (x-axis direction) and do not cross each other.

The (1-3) driving voltage line VDDL3 may be disposed between the first scan line GIi and the second scan line GWi.

The (1-1) driving voltage line VDDL1 may be disposed between the second scan line GWi and the $i^{th}$ emission control line ELi. A part of the (1-1) driving voltage line VDDL1 may overlap the gate electrode DT_G of the driving transistor DT in the third direction (z-axis direction).

The first initialization voltage line VIL1_1 and the second initialization voltage line VIL2_1 may be sequentially arranged in the direction opposite to the second direction (y-axis direction). The first initialization voltage line VIL1_1 and the second initialization voltage line VIL2_1 may be disposed between the first scan line GIi and the $(i−1)^{th}$ emission control line EL(i−1) that is the emission control line of the sub-pixel SP adjacent thereto in the direction opposite to the second direction (y-axis direction).

The third metal layer may include a data line DL, a (1-2) driving voltage line VDDL2, a connection electrode BE, an anode connection electrode ANDE of the light-emitting element LE, a first initialization voltage connection line VIL1_2, and a second initialization voltage connection electrode VIL2_2. The data line DL, the (1-2) driving voltage line VDDL2, and the first initialization voltage connection line VIL1_2 may be extended in the second direction (y-axis direction).

The (1-2) driving voltage VDDL2 may be disposed between the data line DL and the first initialization voltage connection line VIL1_2. The (1-2) driving voltage line VDDL2 may cross the first scan line GIi, the second scan line GWi, the $i^{th}$ emission control line ELi, the first initialization voltage line VIL1_1, the second initialization voltage line VIL2_1 and the (1-1) driving voltage line VDDL1, and may overlap with each of the (1-3) driving voltage line VDDL3 and the active layer in the third direction (z-axis direction).

The connection electrode BE and the anode connection electrode ANDE may be disposed between the (1-2) driving voltage line VDDL2 and the first initialization voltage connection line VIL1_2.

The connection electrode BE may overlap with each of the (1-1) driving voltage line VDDL1, the gate electrode DT_G of the driving transistor DT and the active layer in the third direction (z-axis direction), and may cross the second scan line GWi. The connection electrode BE may overlap with each of the data line DL, the (1-2) driving voltage line VDDL2 and the first initialization voltage connection line VIL1_2 in the first direction (x-axis direction).

The anode connection electrode ANDE may overlap each of the $i^{th}$ emission control line ELi and the active layer in the third direction (z-axis direction). The anode connection electrode ANDE may overlap with each of the data line DL, the (1-2) driving voltage line VDDL2 and the first initialization voltage connection line VIL1_2 in the first direction (x-axis direction). The anode connection electrode ANDE and the connection electrode BE may overlap each other in the second direction (y-axis direction).

The first initialization voltage connection line VIL1_2 may overlap and cross the first initialization voltage line VIL1_1 in the third direction (z-axis direction). The first initialization voltage connection line VIL1_2 may overlap with each of the connection electrode BE, the anode connection electrode ANDE and the second initialization voltage connection electrode VIL2_2 in the first direction (x-axis direction). The first initialization voltage connection line VIL1_2 may overlap with the connection electrode BE and the anode connection electrode ANDE in the second direction (y-axis direction).

The second initialization voltage connection electrode VIL2_2 may be disposed between the first initialization voltage connection line VIL1_2 and the data line DL of the adjacent sub-pixel in the first direction (x-axis direction). The second initialization voltage connection electrode VIL2_2 may overlap with each of the first scan line GIi, the second initialization voltage line VIL2_1 and the (1-3) driving voltage line VDDL3 in the third direction (z-axis direction).

The driving transistor DT may include a channel region DT_CH, a gate electrode DT_G, a first electrode DT_S, and a second electrode DT_D. The channel region DT_CH of the driving transistor DT may overlap the gate electrode DT_G of the driving transistor DT. The connection electrode BE may be disposed on the gate electrode DT_G, and the gate electrode DT_G and the connection electrode BE may be connected to each other through a first contact hole CNT1. The gate electrode DT_G may overlap with the channel region DT_CH of the driving transistor DT, and the connection electrode BE may be connected to the first electrode S4-1 of the (4-1) transistor ST4-1 through a second contact hole CNT2. The first electrode DT_S of the driving transistor DT may be connected to the second electrode D5 of the fifth transistor ST5 and the second electrode D7 of the seventh transistor ST7. The second electrode DT_D of the driving transistor DT may be connected to the first electrode S6 of the sixth transistor ST6 and the first electrode S8 of the eighth transistor ST8.

The first transistor ST1 may include a channel region CH1, a gate electrode G1, a first electrode S1 and a second electrode D1. The gate electrode G1 of the first transistor ST1 may be a part of the first extension GIi' of the first scan line GIi, where the channel region CH1 of the first transistor ST1 and the first extension GIi' of the first scan GI1 overlap each other in a plan view. The first electrode S1 of the first transistor ST1 may be connected to the second initialization voltage connection electrode VIL2_2 through a tenth contact hole CNT10. The second initialization voltage line VIL2_1 may be connected to the second initialization voltage connection electrode VIL2_2 through a ninth contact hole CNT9. The second initialization voltage connection electrode VIL2_2 may be connected to the second electrode D2 of the second transistor ST2 and the first electrode S1 of the first transistor ST1 through the tenth contact hole CNT10. The second initialization voltage connection electrode VIL2_2 may be disposed to cross the first scan line GIi. The second electrode D1 of the first transistor ST1 may be connected to the anode connection electrode ANDE of the $(i-1)^{th}$ sub-pixel SP(i-1) through a sixth contact hole CNT6 of the $(i-1)^{th}$ sub-pixel SP(i-1).

The second transistor ST2 may include a channel region CH2, a gate electrode G2, a first electrode S2 and a second electrode D2. The gate electrode G2 of the second transistor ST2 may be a part of the first protrusion GIi" of the first scan line GIi, where the channel region CH2 of the second transistor ST2 and the first protrusion GIi" of the first scan GIi overlap each other in a plan view. The first electrode S2 of the second transistor ST2 may be connected to the second electrode D3 of the third transistor ST3. The second electrode D2 of the second transistor ST2 may be connected to the first electrode S1 of the first transistor ST1.

The third transistor ST3 may include a channel region CH3, a gate electrode G3, a first electrode S3 and a second electrode D3. The gate electrode G3 of the third transistor ST3 may be a part of the second protrusion GWi" of the second scan line GWi, where the channel region CH3 of the third transistor ST3 and the second protrusion GWi" of the second scan GWi overlap each other in a plan view. The first electrode S3 of the third transistor ST3 may be connected to the first initialization voltage connection electrode VIL1_2 through a fourth contact hole CNT4. The first initialization voltage line VIL1_1 may be connected to the first initialization voltage connection electrode VIL1_2 through a fifth contact hole CNT5. The first initialization voltage connection electrode VIL1_2 may be connected to the first electrode S4-1 of the (4-2) transistor ST4-2 and the first electrode S3 of the third transistor ST3 through the fourth contact hole CNT4. The first initialization voltage connection line VIL1_2 may be disposed so that it crosses the first scan line GIi, the second scan line GWi and the $i^{th}$ emission control line ELi.

The channel region CH2 of the second transistor ST2 and the channel region CH3 of the third transistor ST3 may be connected with each other, and the gate electrode G2 of the second transistor ST2 and the gate electrode G3 of the third transistor ST3 may overlap each other in the first direction (x-axis direction).

The fourth transistor ST4 may be implemented as a dual transistor. The fourth transistor ST4 may include the (4-1) transistor ST4-1 and the (4-2) transistor ST4-2.

The (4-1) transistor ST4-1 may include a channel region CH4-1, a gate electrode G4-1, a first electrode S4-1, and a second electrode D4-1. The gate electrode G4-1 of the fourth transistor ST4-1 may be a part of the first extension GIi' of the first scan line GIi, where the channel region CH4-1 of the (4-1) transistor ST4-1 and the first extension GIi' of the first scan GI1 overlap each other in a plan view. The first electrode S4-1 of the (4-1) transistor ST4-1 may be connected to the second electrode D4-2 of the (4-2) transistor ST4-2. The second electrode D4-1 of the (4-1) transistor ST4-1 may be connected to the gate electrode DT_G of the driving transistor DT through the second contact hole CNT2. The (4-2) transistor ST4-2 may include a channel region CH4-2, a gate electrode G4-2, a first electrode S4-2, and a second electrode D4-2. The gate electrode G4-2 of the (4-2) transistor ST4-2 may be a part of the first extension GIi' of the first scan line GIi, where the channel region CH4-2 of the (4-2) transistor ST4-2 and the first extension GIi' of the first scan GI1 overlap each other in a plan view. The first electrode S4-2 of the (4-2) transistor ST4-2 may be connected to the first initialization voltage connection electrode VIL1_2 through the fourth contact hole CNT4. The second electrode D4-2 of the (4-2) transistor ST4-2 may be connected to the first electrode S4-1 of the (4-1) transistor ST4-1. The fifth transistor ST5 may include a channel region CH5, a gate electrode G5, a first electrode S5, and a second electrode D5. The gate electrode G5 of the fifth transistor ST5 may be a part of the second extension GWi' of the second scan line GWi, where the channel region CH5 of the fifth transistor ST5 and the second extension GWi' of the second scan GWi overlap each other in a plan view. The first electrode S5 of the fifth transistor ST5 may be connected to the $j^{th}$ data line Dj through a third contact hole CNT3. The second electrode D5 of the fifth transistor ST5 may be connected to the first electrode DT_S of the driving transistor DT. The sixth transistor ST6 may be implemented as a dual transistor. The sixth transistor ST6 may include the (6-1) transistor ST6-1 and the (6-2) transistor ST6-2.

The (6-1) transistor ST6-1 may include a channel region CH6-1, a gate electrode G6-1, a first electrode S6-1, and a second electrode D6-1. The gate electrode G6-1 of the (6-1) transistor ST6-1 may be a part of the second protrusion GWi'' of the second scan line GWi, where the channel region CH6-1 of the (6-1) transistor ST6-1 and the second protrusion GWi'' of the second scan GWi overlap each other in a plan view. The first electrode S6-1 of the (6-1) transistor ST6-1 may be connected to the second electrode D6-2 of the (6-2) transistor ST6-2. The second electrode D6-1 of the (6-1) transistor ST6-1 may be connected to the gate electrode DT_G of the driving transistor DT through the second contact hole CNT2.

The gate electrode G6-1 of the (6-1) transistor ST6-1 and the gate electrode G3 of the third transistor ST3 may overlap each other in the second direction (y-axis direction).

The (6-2) transistor ST6-2 may include an active layer ACT6-2, a gate electrode G6-2, a first electrode S6-2, and a second electrode D6-2. The gate electrode G6-2 of the (6-2) transistor ST6-2 may be a part of the second extension GWi' of the second scan line GWi, where the active layer ACT6-2 of the (6-2) transistor ST6-2 and the second extension GWi' of the second scan GWi overlap each other in a plan view. The first electrode S6-2 of the (6-2) transistor ST6-2 may be connected to the second electrode DT_D of the driving transistor DT. The second electrode D6-2 of the (6-2) transistor ST6-2 may be connected to the first electrode S6-1 of the (6-1) transistor ST6-1. The seventh transistor ST7 may include a channel region CH7, a gate electrode G7, a first electrode S7 and a second electrode D7. The gate electrode G7 of the seventh transistor ST7 may be a part of the ith emission control line ELi, where the channel region CH7 of the seventh transistor ST7 and the ith emission control line ELi overlap each other in a plan view. The first electrode S7 of the seventh transistor ST7 may be connected to a (1-2) driving voltage line VDDL2 through a seventh contact hole CNT7. The second electrode D7 of the seventh transistor ST7 may be connected to the first electrode DT_S of the driving transistor DT.

The eighth transistor ST8 may include a channel region CH8, a gate electrode G8, a first electrode S8 and a second electrode D8. The gate electrode G8 of the eighth transistor ST8 may be a part of the $i^{th}$ emission control line ELi, where the channel region CH8 of the eighth transistor ST8 and the $i^{th}$ emission control line ELi overlap each other in a plan view. The first electrode S8 of the eighth transistor ST8 may be connected to the second electrode DT_D of the driving transistor DT. The second electrode D8 of the eighth transistor ST8 may be connected to the anode connection electrode ANDE through the sixth contact hole CNT6.

The first electrode CE1 of the capacitor C1 may be substantially identical to the gate electrode DT_G of the driving transistor DT, and the second electrode CE2 of the capacitor C1 may be the (1-1) driving voltage line VDDL1 overlapping with the gate electrode DT_G of the driving transistor DT in a plan view. The capacitor C1 may hold the voltage at the gate electrode of the driving transistor DT for one frame.

The capacitance of the capacitor C1 is proportional to the area where the gate electrode DT_G of the driving transistor DT and the (1-1) driving voltage line VDDL1 overlap each other in a plan view. In other words, the capacitance of the capacitor C1 can be increased with the area where the gate electrode DT_G of the driving transistor DT and the (1-1) driving voltage line VDDL1 overlap each other in a plan view.

As shown in FIG. 9, by adding the second and third transistors ST2 and ST3 between the first transistor ST1 and the fourth transistor ST4, the active layer of the first transistor ST1 may be connected to the active layer of the fourth transistor ST4 without being disconnected. Accordingly, the active layer of a sub-pixel may be formed integrally with the active layers of the adjacent sub-pixels SP in the second direction (y-axis direction). Therefore, when static electricity is applied to the active layer during the fabricating process, an electrostatic path is formed by the active layers of the adjacent sub-pixels SP in the second direction (y-axis direction) so that static electricity can be discharged to the outside or dispersed. Therefore, it is possible to prevent the active layer from being burnt and damaged by static electricity during the process.

Figure 13:
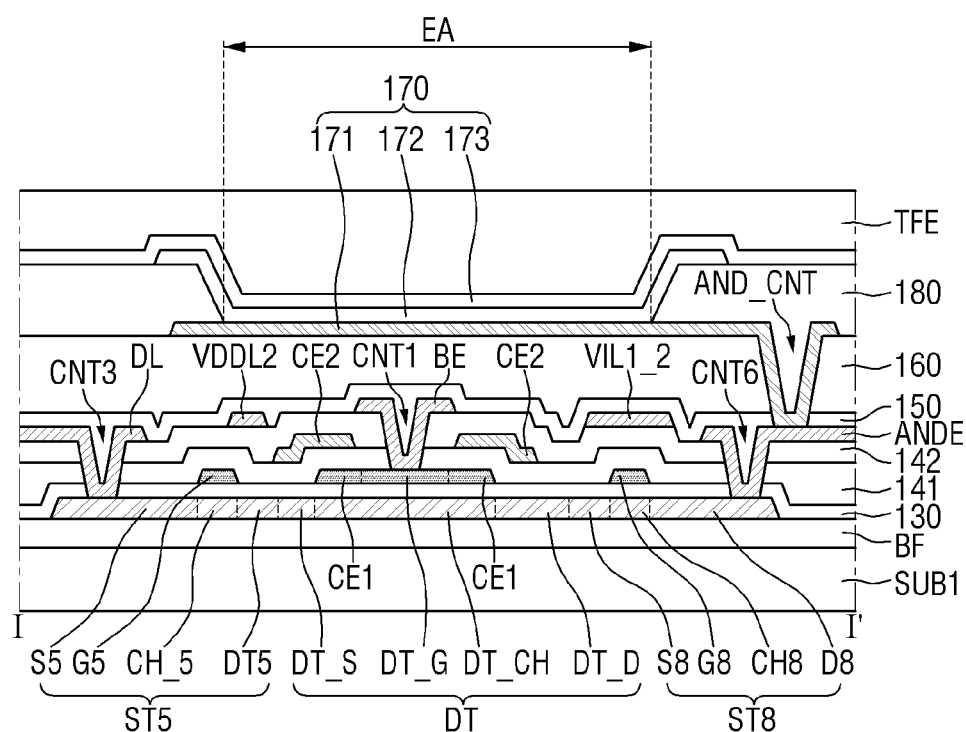
FIG. 13 is a cross-sectional view taken along line I-I' of FIG. 9.
Figure 14:
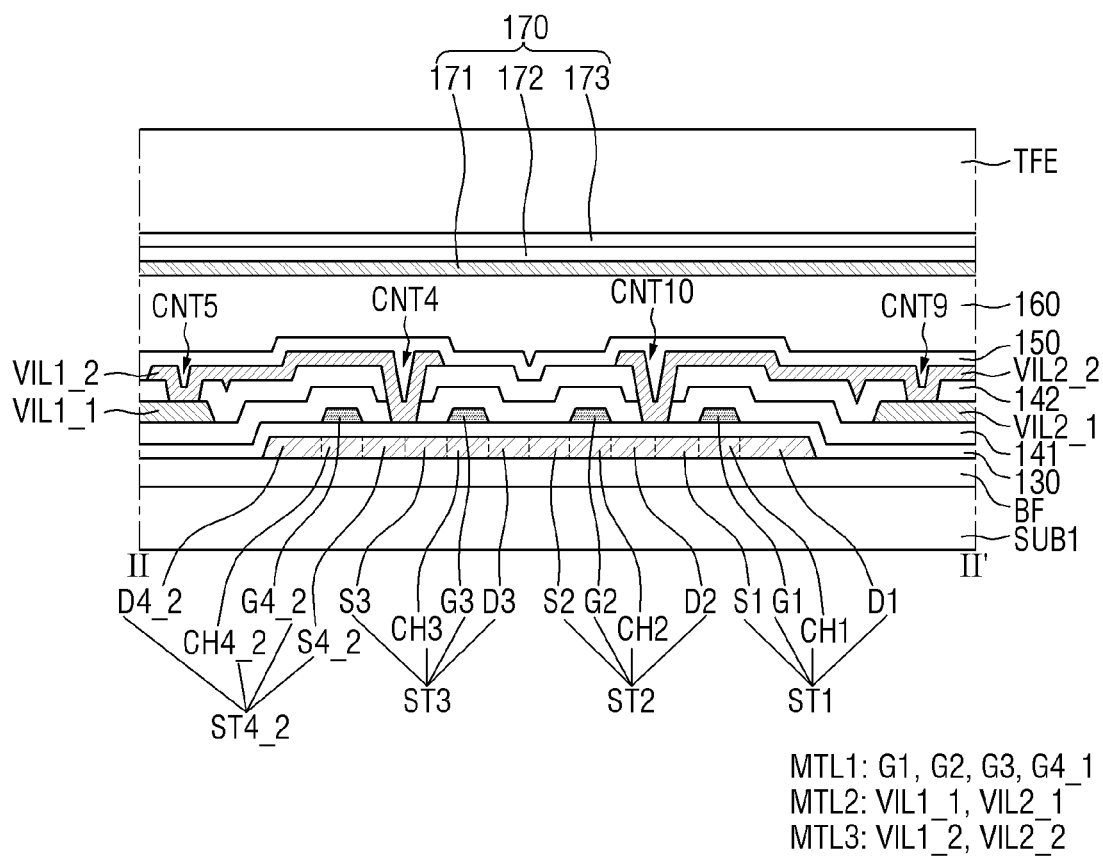
FIG. 14 is a cross-sectional view taken along line II-II' of FIG. 9.

FIG. 13 is a cross-sectional view taken along line I-I' of FIG. 9. FIG. 14 is a cross-sectional view taken along line II-II' of FIG. 9.

Referring to FIGS. 13 and 14, a thin-film transistor layer TFTL, an emissive layer EML, and an encapsulation layer TFE may be sequentially formed on a first substrate SUB1. The thin-film transistor TFTL includes a buffer film BF, an active layer ACT, a first metal layer MTL1, a second metal layer MTL2, a third metal layer MTL3, a gate insulator 130, a first interlayer dielectric layer 141, a second interlayer dielectric layer 142, a protective layer 150, and a planarization layer 160.

The buffer film BF may be formed on a surface of the first substrate SUB1. The buffer film BF may be formed on the surface of the first substrate SUB1 in order to protect the thin-film transistors and an organic emitting layer 172 of the emissive layer EML from moisture that is likely to permeate through the first substrate SUB1. The buffer layer BF may be formed of a plurality of inorganic layers stacked on one another alternately. For example, the buffer layer BF may be made up of multiple layers in which one or more inorganic layers of a silicon nitride layer, a silicon oxynitride layer, a silicon oxide layer, a titanium oxide layer and an aluminum oxide layer are alternately stacked on one another. The buffer film BF may be eliminated.

The active layer ACT may be formed on the first substrate SUB1 or the buffer film BF. The active layer ACT may include polycrystalline silicon, single crystal silicon, low-temperature polycrystalline silicon, amorphous silicon, or an oxide semiconductor.

When the active layer ACT is made of polycrystalline silicon by doping ions into the active layer ACT, the active layer ACT can have conductivity. Accordingly, the active layer ACT may include not only the channel regions DT_CH and CH1 to CH8 of the driving transistor DT and the first to eighth transistors ST1 to ST8 but also the first electrodes DT_S, S1, S2, S3, S4-1, S4-2, S5, S6-1, S6-2, S7 and S8, and the second electrodes DT_D, D1, D2, D3, D4-1, D4-2, D5, D6-1, D6-2, D7 and D8.

The gate insulator 130 may be formed on the active layer ACT. The gate insulator 130 may be formed of an inorganic layer, for example, a silicon nitride layer, a silicon oxynitride layer, a silicon oxide layer, a titanium oxide layer, or an aluminum oxide layer.

The first metal layer MTL1 may be formed on the gate insulator 130. The first metal layer MTL1 may include not only the gate electrodes DT_G1 and G1 to G8 of the driving transistor DT and the first to eighth transistors ST1 to ST8 but also the scan lines GIi and GWi and the emission control line ELi. The first metal layer MTL1 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

The first interlayer dielectric layer 141 may be formed on the first metal layer MTL1. The first interlayer dielectric layer 141 may be formed of an inorganic layer, for example, a silicon nitride layer, a silicon oxynitride layer, a silicon oxide layer, a titanium oxide layer, or an aluminum oxide layer. The first interlayer dielectric layer 141 may include a number of inorganic layers.

The second metal layer MTL2 may be formed on the first interlayer dielectric layer 141. The second metal layer MTL2 may include a first initialization voltage line VIL1, a second initialization voltage line VIL2_1, a (1-1) driving voltage line VDDL1, and a (1-3) driving voltage line VDDL3. The second metal layer MTL2 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

The second interlayer dielectric layer 142 may be formed on the second metal layer MTL2. The second interlayer dielectric layer 142 may be formed of an inorganic layer, for example, a silicon nitride layer, a silicon oxynitride layer, a silicon oxide layer, a titanium oxide layer, or an aluminum oxide layer. The second interlayer dielectric layer 142 may include a number of inorganic layers.

The third metal layer MTL3 may be formed on the second interlayer dielectric layer 142. The third metal layer MTL3 may include data lines DL, (1-2) driving voltage lines VDDL2, a connection electrode BE, an anode connection electrode ANDE, a first initialization voltage connection line VIL1_2, and a second initialization voltage connection electrode VIL2_2. The third metal layer MTL3 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

The planarization layer 160 may be formed on the third metal layer MTL3 to provide a flat surface over the active layer ACT, the first metal layer MTL1, the second metal layer MTL2, and the third metal layer MTL3. The planarization layer 160 may be formed of an organic layer such as an acryl resin, an epoxy resin, a phenolic resin, a polyamide resin and a polyimide resin.

The protective layer 150 may be further formed between the third metal layer MTL3 and the planarization layer 160. The protective layer 150 may be formed of an inorganic layer, for example, a silicon nitride layer, a silicon oxynitride layer, a silicon oxide layer, a titanium oxide layer, or an aluminum oxide layer.

Although the driving transistor DT and the first to eighth transistors ST1 to ST8 are implemented as top-gate transistors in each of which the gate electrode is located above the active layer in the example shown, the present disclosure is not limited thereto. That is to say, the driving transistor DT and the first to eighth transistors ST1 to ST8 may be implemented as bottom-gate transistors in which the gate electrode is located below the active layer 121, or as double-gate transistors in which the gate electrodes are disposed above and below the active layer.

The first contact hole CNT1 may be a hole that penetrates the first interlayer dielectric layer 141 and the second interlayer dielectric layer 142, via which the gate electrode DT_G of the driving transistor DT is exposed as shown in FIG. 14. The connection electrode BE may be connected to the gate electrode DT_G of the driving transistor DT through the first contact hole CNT1.

The second contact hole CNT2 may be formed through the gate insulator 130, the first interlayer dielectric layer 141 and the second interlayer dielectric layer 142, via which the second electrode D6-1 of the (6-1) transistor ST6-1 is exposed. The connection electrode BE may be connected to the second electrode D6-1 of the (6-1) transistor ST6-1 through the second contact hole CNT2.

The third contact hole CNT3 may be formed through the gate insulator 130, the first interlayer dielectric layer 141 and the second interlayer dielectric layer 142, via which the first electrode S5 of the fifth transistor ST5 is exposed. The $j^{th}$ data line Dj may be connected to the first electrode S1 of the first transistor ST1 through the third contact hole CNT3.

The fourth contact hole CNT4 may be formed through the gate insulator 130, the first interlayer dielectric layer 141 and the second interlayer dielectric layer 142, via which the first electrode S4-2 of the (4-2) transistor ST4-2 and the first electrode S1 of the third transistor ST3 are exposed. The first initialization voltage connection line VIL1_2 may be connected to the first electrode S4-2 of the (4-2) transistor ST4-2 and the first electrode S3 of the third transistor ST3 through the fourth contact hole CNT4.

The fifth contact hole CNT5 may be formed through the second interlayer dielectric layer 142, via which the first initialization voltage line VIL1_1 is exposed. The first initialization voltage connection line VIL1_2 may be connected to the first initialization voltage line VIL1 through the fifth contact hole CNT5.

The sixth contact hole CNT6 may be formed through the gate insulator 130, the first interlayer dielectric layer 141 and the second interlayer dielectric layer 142, via which the second electrode D8 of the eighth transistor ST8 is exposed. The anode connection electrode ANDE may be connected to the second electrode D8 of the eighth transistor ST8 through the sixth contact hole CNT6.

The seventh contact hole CNT7 may be formed through the gate insulator 130, the first interlayer dielectric layer 141 and the second interlayer dielectric layer 142, via which the first electrode S7 of the seventh transistor ST7 is exposed. The (1-2) driving voltage line VDDL2 may be connected to the first electrode S7 of the seventh transistor ST7 through the seventh contact hole CNT7.

The eighth contact hole CNT8 may be formed through the second interlayer dielectric layer 142, via which the (1-1) driving voltage line VDDL1 is exposed. The (1-2) driving voltage line VDDL2 may be connected to the (1-1) driving voltage line VDDL1 through the eighth contact hole CNT8.

The ninth contact hole CNT9 may be formed through the second interlayer dielectric layer 142, via which the second initialization voltage line VIL2_1 is exposed. The second initialization voltage connection line VIL2_2 may be connected to the second initialization voltage line VIL2_1 through the ninth contact hole CNT9.

The tenth contact hole CNT10 may be formed through the gate insulator 130, the first interlayer dielectric layer 141 and the second interlayer dielectric layer 142, via which the first electrode S1 of the first transistor ST1 and the second electrode D2 of the second transistor ST2 are exposed. The second initialization voltage connection line VIL2_2 may be connected to the first electrode S1 of the first transistor ST1 and the second electrode S2 of the second transistor ST2 through the tenth contact hole CNT10.

An eleventh contact hole CNT11 may be formed through the second interlayer dielectric layer 142, via which the (1-3) driving voltage line VDDL3 is exposed. The (1-2) driving voltage line VDDL2 may be connected to the (1-3) driving voltage line VDDL3 through the eleventh contact hole CNT11.

An anode contact hole AND_CNT may be formed through the protective layer 150 and the planarization layer 160, via which the anode connection electrode ANDE is exposed.

The emissive layer EML is formed on the thin-film transistor layer TFTL. The emissive layer EML includes light-emitting elements 170 and a pixel-defining layer 180.

The light-emitting elements 170 and the pixel-defining layer 180 are formed on the planarization layer 160. Each of the light-emitting elements 170 may include a first electrode 171, an organic emitting layer 172, and a second electrode 173.

The first electrode 171 may be formed on the planarization layer 160. The first electrode 171 may be connected to the anode connection electrode ANDE through the anode contact hole AND_CNT penetrating through the protective layer 150 and the planarization layer 160.

In the top-emission organic light-emitting diode that light exits from the organic emitting layer 172 toward the second electrode 173, the first electrode 171 may be made of a metal material having a high reflectivity such as a stack structure of aluminum and titanium (Ti/Al/Ti), a stack structure of aluminum and ITO ("ITO"/Al/"ITO"), an APC alloy and a stack structure of APC alloy and ITO (ITO/APC/ITO). The APC alloy is an alloy of silver (Ag), palladium (Pd) and copper (Cu).

The pixel-defining layer 180 may be formed on the planarization layer 250 to partition the first electrode 171 in order to define an emission area EA of each of the sub-pixels SP. The pixel-defining layer 180 may be formed to cover the edge of the first electrode 171. The pixel-defining layer 180 may be formed of an organic layer such as an acryl resin, an epoxy resin, a phenolic resin, a polyamide resin and a polyimide resin.

In the emission area EA of each of the sub-pixels SP, the first electrode 171, the organic emitting layer 172 and the second electrode 173 are stacked on one another in this order, so that holes from the first electrode 171 and electrons from the second electrode 173 are combined with each other in the organic emitting layer 172 to emit light.

The organic emitting layer 172 is formed on the first electrode 171 and the pixel-defining layer 180. The organic emitting layer 172 may include an organic material and emit light of a certain color. For example, the organic emitting layer 172 may include a hole transporting layer, an organic material layer, and an electron transporting layer.

The second electrode 173 is formed on the organic emitting layer 172. The second electrode 173 may be formed to cover the organic emitting layer 172. The second electrode 173 may be a common layer formed across the sub-pixels SP. A capping layer may be formed on the second electrode 173.

In the top-emission organic light-emitting diode, the second electrode 173 may be formed of a transparent conductive material ("TCP") such as ITO and IZO that can transmit light, or a semi-transmissive conductive material such as magnesium (Mg), silver (Ag) and an alloy of magnesium (Mg) and silver (Ag). When the second electrode 173 is formed of a semi-transmissive conductive material, the light extraction efficiency can be increased by using microcavities.

The encapsulation layer TFE may be formed on the light-emitting element layer EML. The encapsulation layer TFE may include at least one inorganic film to prevent permeation of oxygen or moisture into the emissive layer EML. In addition, the encapsulation layer TFE may include at least one organic film to protect the emissive layer EML from particles such as dust.

Alternatively, a second substrate may be disposed on the light-emitting element layer EML instead of the encapsulation layer TFE, such that the space between the light-emitting element layer EML and the second substrate may be empty or filled with a filling film. The filler film may be an epoxy filler film or a silicon filler film.

As shown in FIG. 14, as the second transistor ST2 and the third transistor ST3 are disposed between the (4-2) transistor ST4-2 and the first transistor ST1, the active layer of the first transistor ST1 and the active layer of the fourth transistor ST4 may be connected with each other without being disconnected. Accordingly, the active layer of a sub-pixel may be formed integrally with the active layers of the adjacent sub-pixels SP in the second direction (y-axis direction). Therefore, when static electricity is applied to the active layer during the fabricating process, a path for discharging static electricity is formed by the active layers of the adjacent sub-pixels SP in the second direction (y-axis direction) so that static electricity can be discharged to the outside or dispersed. Therefore, it is possible to prevent the active layer from being burnt and damaged by static electricity during the process.

Figure 15:
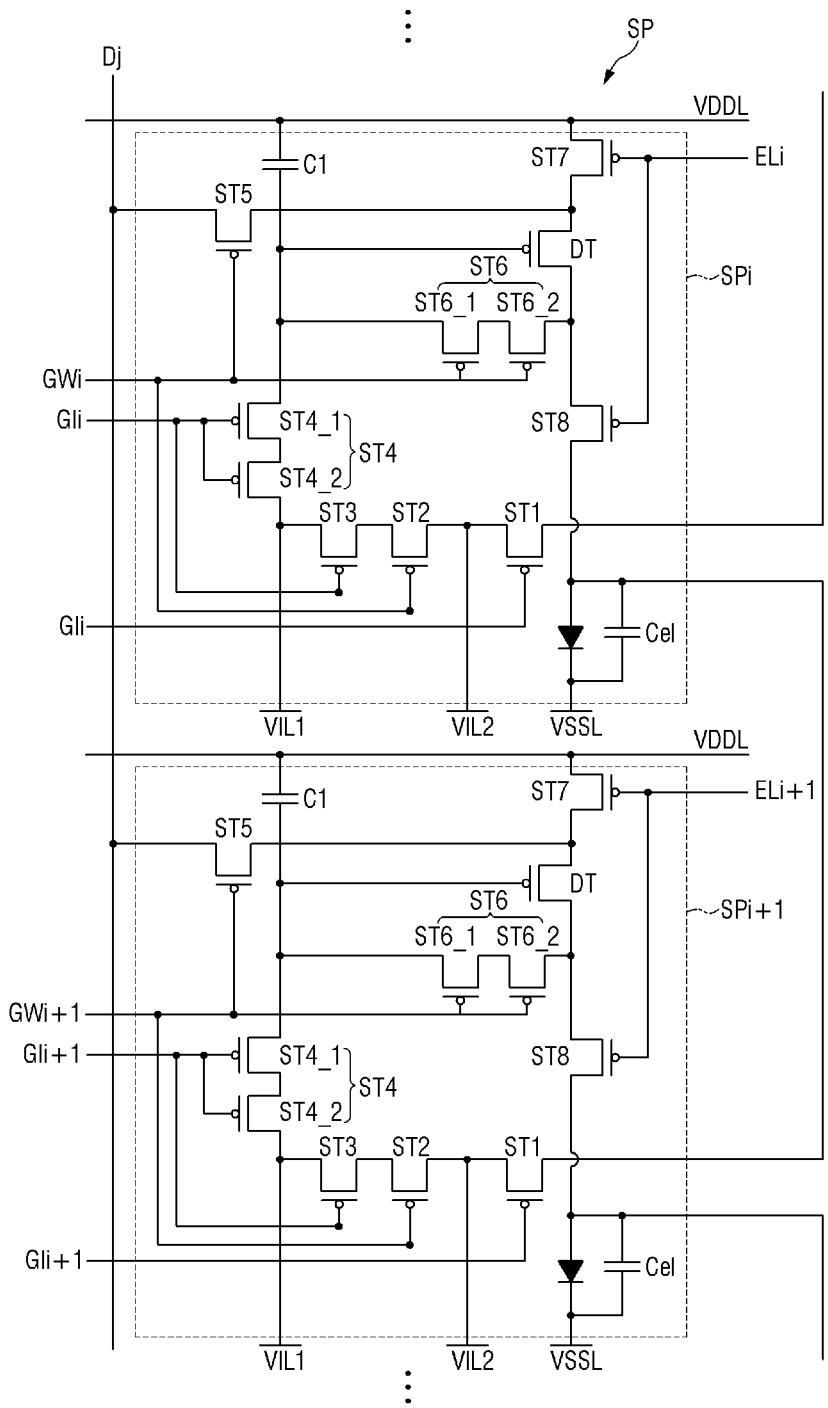
FIG. 15 is a circuit diagram showing a sub-pixel according to yet another exemplary embodiment of the present disclosure.

FIG. 15 is a circuit diagram showing a sub-pixel according to yet another exemplary embodiment of the present disclosure.

The exemplary embodiment of FIG. 15 is different from the exemplary embodiment of FIG. 4 in that a gate electrode of a second transistor ST2 of the i$^{th}$ sub-pixel SPi is connected to a second scan line GWi, and a gate electrode of a third transistor ST3 of the i$^{th}$ sub-pixel SPi is connected to a first scan line GIi. The following description will focus on the differences.

When the signals applied to the first scan line GIi, the second scan line GWi and the i$^{th}$ emission control line Eli connected to the i$^{th}$ sub-pixel SPi of FIG. 5 are applied to the i$^{th}$ sub-pixel SPi of FIG. 15, the second transistor ST2 and the third transistor ST3 of the i$^{th}$ sub-pixel SPi operate as follows during the first to third time periods t1 to t3.

During the first time period t1, the third transistor ST3 of the i$^{th}$ sub-pixel SPi is turned on while the second transistor ST2 of the i$^{th}$ sub-pixel SPi is turned off, and the first initialization voltage line VIL1 and the second initialization voltage line VIL2 connected to the first i$^{th}$ sub-pixel SPi are electrically separated from each other.

During the second time period t2, the second transistor ST2 of the i$^{th}$ sub-pixel SPi is turned on while the third transistor ST3 of the i$^{th}$ sub-pixel SPi is turned off, and the first initialization voltage line VIL1 and the second initialization voltage line VIL2 connected to the first i$^{th}$ sub-pixel SPi are electrically separated from each other.

During the third time period t3, the second transistor ST2 as well as the third transistor ST3 of the i$^{th}$ sub-pixel SPi are turned off, and the first initialization voltage line VIL1 and the second initialization voltage line VIL2 connected to the first i$^{th}$ sub-pixel SPi are electrically separated from each other.

That is to say, during the first to third time periods t1 to t3, the second transistor ST2 and the third transistor ST3 of the i$^{th}$ sub-pixel SPi are never turned on simultaneously, and thus it is possible to prevent the first initialization voltage line VIL1 and the second initialization voltage line VIL2 connected to the first i$^{th}$ sub-pixel SPi from being electrically connected with each other to form a short circuit.

Figure 16:
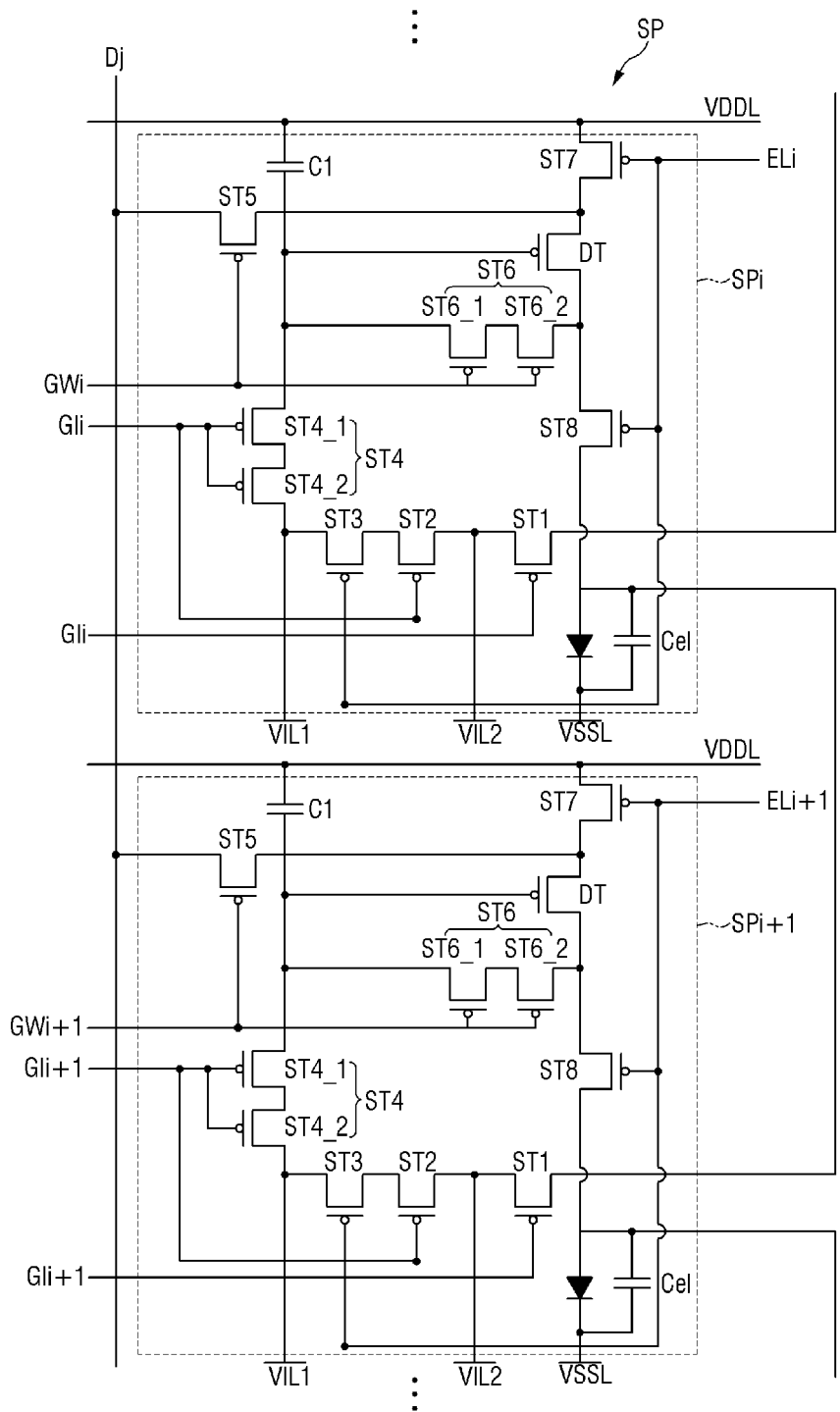
FIG. 16 is a circuit diagram showing a sub-pixel according to yet another exemplary embodiment of the present disclosure.

FIG. 16 is a circuit diagram showing a sub-pixel according to yet another exemplary embodiment of the present disclosure.

The exemplary embodiment of FIG. 16 is different from the exemplary embodiment of FIG. 4 in that a gate electrode of a third transistor ST3 of the i$^{th}$ sub-pixel SPi is connected to the i$^{th}$ emission control line ELi. The following description will focus on the differences.

When the signals applied to the first scan line GIi, the second scan line GWi and the i$^{th}$ emission control line Eli connected to the i$^{th}$ sub-pixel SPi of FIG. 5 are applied to the i$^{th}$ sub-pixel SPi of FIG. 16, the second transistor ST2 and the third transistor ST3 of the i$^{th}$ sub-pixel SPi operate as follows during the first to third time periods t1 to t3.

During the first time period t1, the second transistor ST2 of the i$^{th}$ sub-pixel SPi is turned on while the third transistor ST3 of the i$^{th}$ sub-pixel SPi is turned off, and the first initialization voltage line VIL1 and the second initialization voltage line VIL2 connected to the first i$^{th}$ sub-pixel SPi are electrically separated from each other.

During the second time period t2, the second transistor ST2 as well as the third transistor ST3 of the i$^{th}$ sub-pixel SPi are turned off, and the first initialization voltage line VIL1 and the second initialization voltage line VIL2 connected to the first i$^{th}$ sub-pixel SPi are electrically separated from each other.

During the third time period t3, the third transistor ST3 of the i$^{th}$ sub-pixel SPi is turned on while the second transistor ST2 is turned off, and the first initialization voltage line VIL1 and the second initialization voltage line VIL2 connected to the first i$^{th}$ sub-pixel SPi are electrically separated from each other.

That is to say, during the first to third time periods t1 to t3, the second transistor ST2 and the third transistor ST3 are never turned on simultaneously, and thus it is possible to prevent the first initialization voltage line VIL1 and the second initialization voltage line VIL2 connected to the first i$^{th}$ sub-pixel SPi from being electrically connected with each other to form a short circuit.

Figure 17:
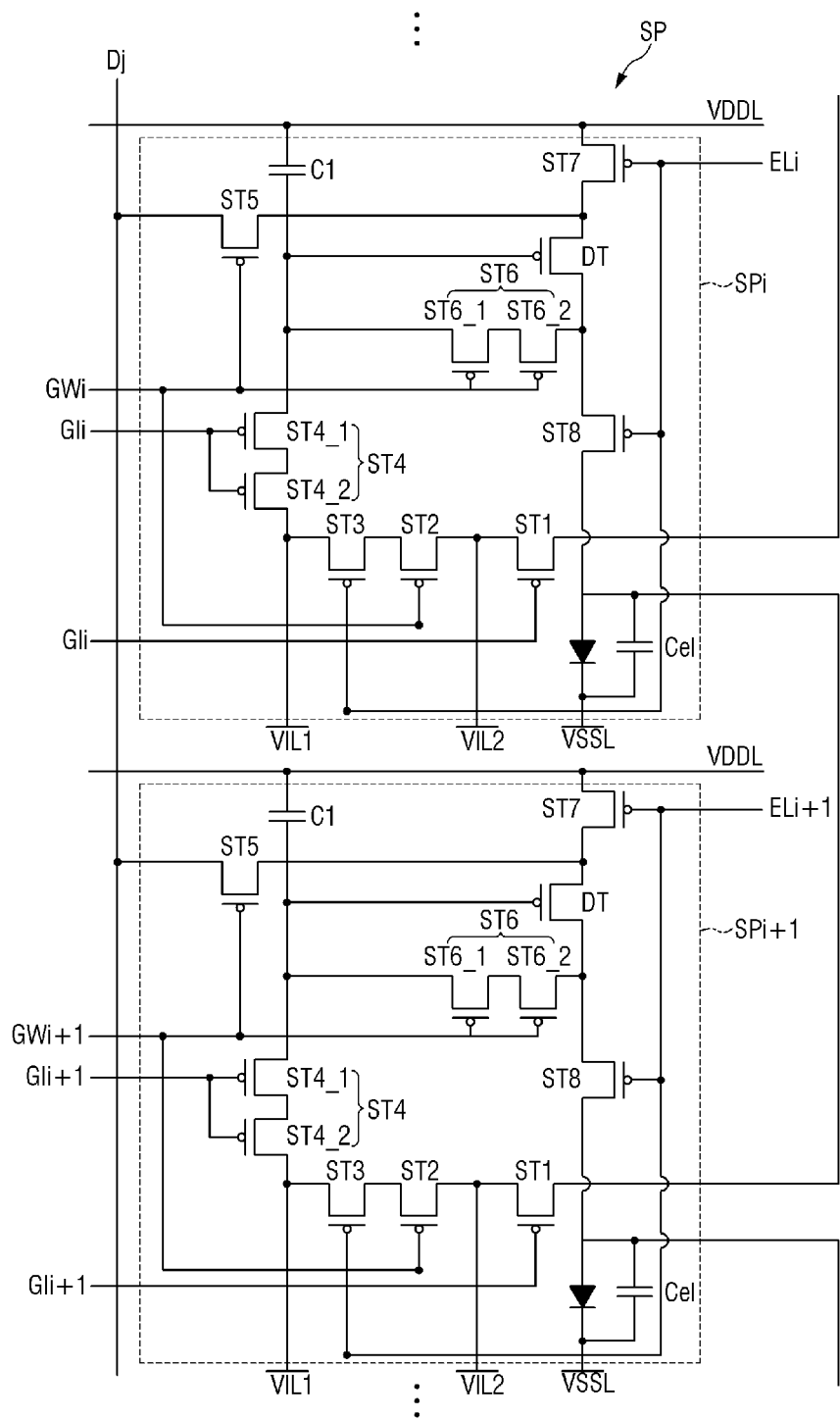
FIG. 17 is a circuit diagram showing a sub-pixel according to yet another exemplary embodiment of the present disclosure.

FIG. 17 is a circuit diagram showing a sub-pixel according to yet another exemplary embodiment of the present disclosure.

The exemplary embodiment of FIG. 17 is different from the exemplary embodiment of FIG. 4 in that a gate electrode of a second transistor ST2 of the i$^{th}$ sub-pixel SPi is connected to a second scan line GWi, and a gate electrode of a third transistor ST3 of the i$^{th}$ sub-pixel SPi is connected to the i$^{th}$ emission control line Eli. The following description will focus on the differences.

When the signals applied to the first scan line GIi, the second scan line GWi and the i$^{th}$ emission control line Eli connected to the i$^{th}$ sub-pixel SPi of FIG. 5 are applied to the i$^{th}$ sub-pixel SPi of FIG. 17, the second transistor ST2 and the third transistor ST3 of the i$^{th}$ sub-pixel SPi operate as follows during the first to third time periods t1 to t3.

During the first time period t1, the second transistor ST2 as well as the third transistor ST3 of the i$^{th}$ sub-pixel SPi are turned off, and the first initialization voltage line VIL1 and the second initialization voltage line VIL2 connected to the first i$^{th}$ sub-pixel SPi are electrically separated from each other.

During the second time period t2, the second transistor ST2 of the i$^{th}$ sub-pixel SPi is turned on while the third transistor ST3 of the i$^{th}$ sub-pixel SPi is turned off, and the first initialization voltage line VIL1 and the second initialization voltage line VIL2 connected to the first i$^{th}$ sub-pixel SPi are electrically separated from each other.

During the third time period t3, the third transistor ST3 of the i$^{th}$ sub-pixel SPi is turned on while the second transistor ST2 of the i$^{th}$ sub-pixel SPi is turned off, and the first initialization voltage line VIL1 and the second initialization voltage line VIL2 connected to the first i$^{th}$ sub-pixel SPi are electrically separated from each other.

That is to say, during the first to third time periods t1 to t3, the second transistor ST2 and the third transistor ST3 of the i$^{th}$ sub-pixel SPi are never turned on simultaneously, and thus it is possible to prevent the first initialization voltage line VIL1 and the second initialization voltage line VIL2 connected to the first i$^{th}$ sub-pixel SPi from being electrically connected with each other to form a short circuit.

Figure 18:
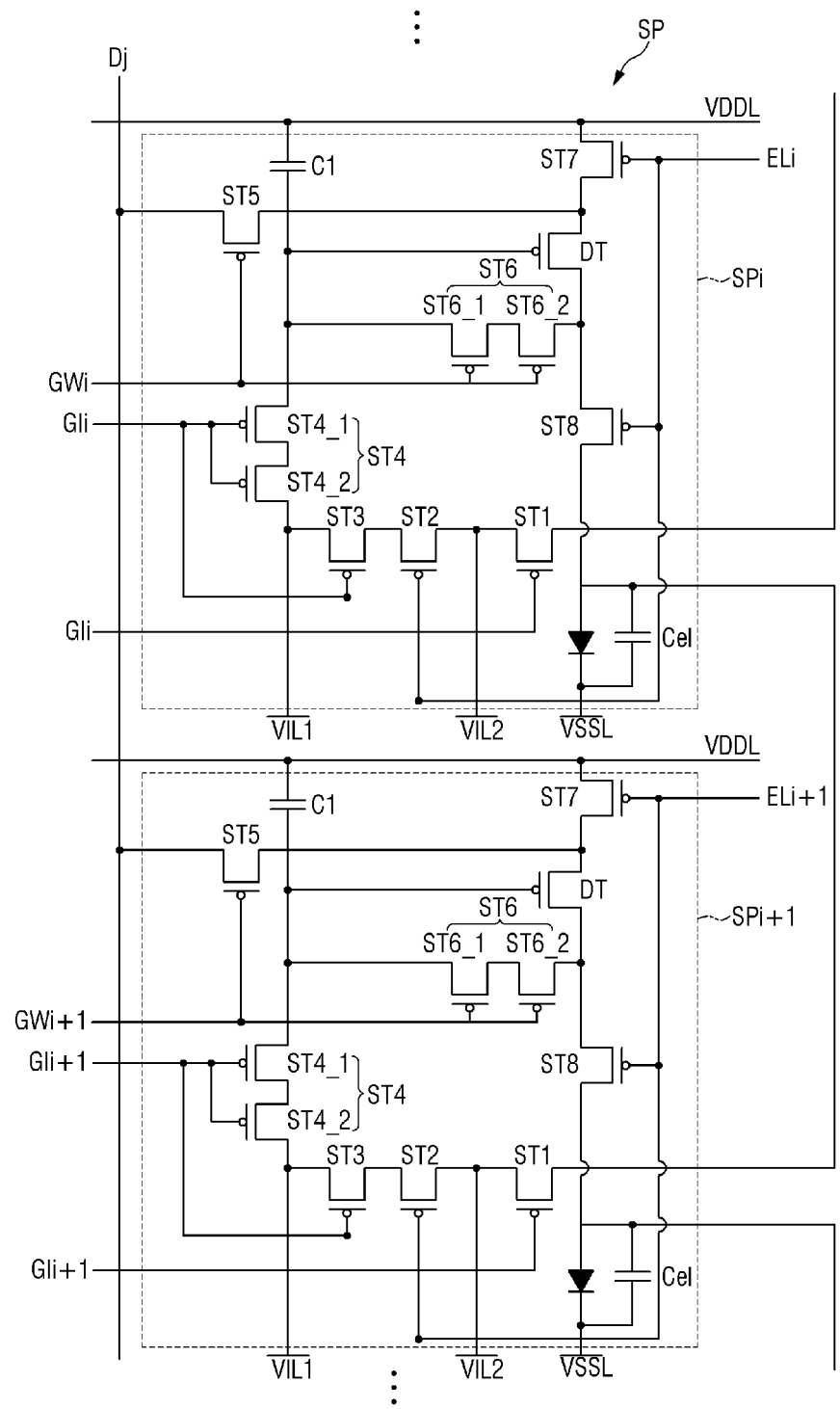
FIG. 18 is a circuit diagram showing a sub-pixel according to yet another exemplary embodiment of the present disclosure.

FIG. 18 is a circuit diagram showing a sub-pixel according to yet another exemplary embodiment of the present disclosure.

The exemplary embodiment of FIG. 18 is different from the exemplary embodiment of FIG. 4 in that a gate electrode of a second transistor ST2 of the i$^{th}$ sub-pixel SPi is connected to the i$^{th}$ emission control line Eli, and a gate electrode of a third transistor ST3 of the i$^{th}$ sub-pixel SPi is connected to a first scan line GIi. The following description will focus on the differences.

When the signals applied to the first scan line GIi, the second scan line GWi and the $i^{th}$ emission control line Eli connected to the $i^{th}$ sub-pixel SPi of FIG. 5 are applied to the $i^{th}$ sub-pixel SPi of FIG. 18, the second transistor ST2 and the third transistor ST3 of the $i^{th}$ sub-pixel SPi operate as follows during the first to third time periods t1 to t3.

During the first time period t1, the second transistor ST2 of the $i^{th}$ sub-pixel SPi is turned on while the third transistor ST3 of the $i^{th}$ sub-pixel SPi is turned off, and the first initialization voltage line VIL1 and the second initialization voltage line VIL2 connected to the first $i^{th}$ sub-pixel SPi are electrically separated from each other.

During the second time period t2, the second transistor ST2 as well as the third transistor ST3 of the $i^{th}$ sub-pixel SPi are turned off, and the first initialization voltage line VIL1 and the second initialization voltage line VIL2 connected to the first $i^{th}$ sub-pixel SPi are electrically separated from each other.

During the third time period t3, the third transistor ST3 of the $i^{th}$ sub-pixel SPi is turned on while the second transistor ST2 of the $i^{th}$ sub-pixel SPi is turned off, and the first initialization voltage line VIL1 and the second initialization voltage line VIL2 connected to the first $i^{th}$ sub-pixel SPi are electrically separated from each other.

That is to say, during the first to third time periods t1 to t3, the second transistor ST2 and the third transistor ST3 of the $i^{th}$ sub-pixel SPi are never turned on simultaneously, and thus it is possible to prevent the first initialization voltage line VIL1 and the second initialization voltage line VIL2 connected to the first $i^{th}$ sub-pixel SPi from being electrically connected with each other to form a short circuit.

Figure 19:
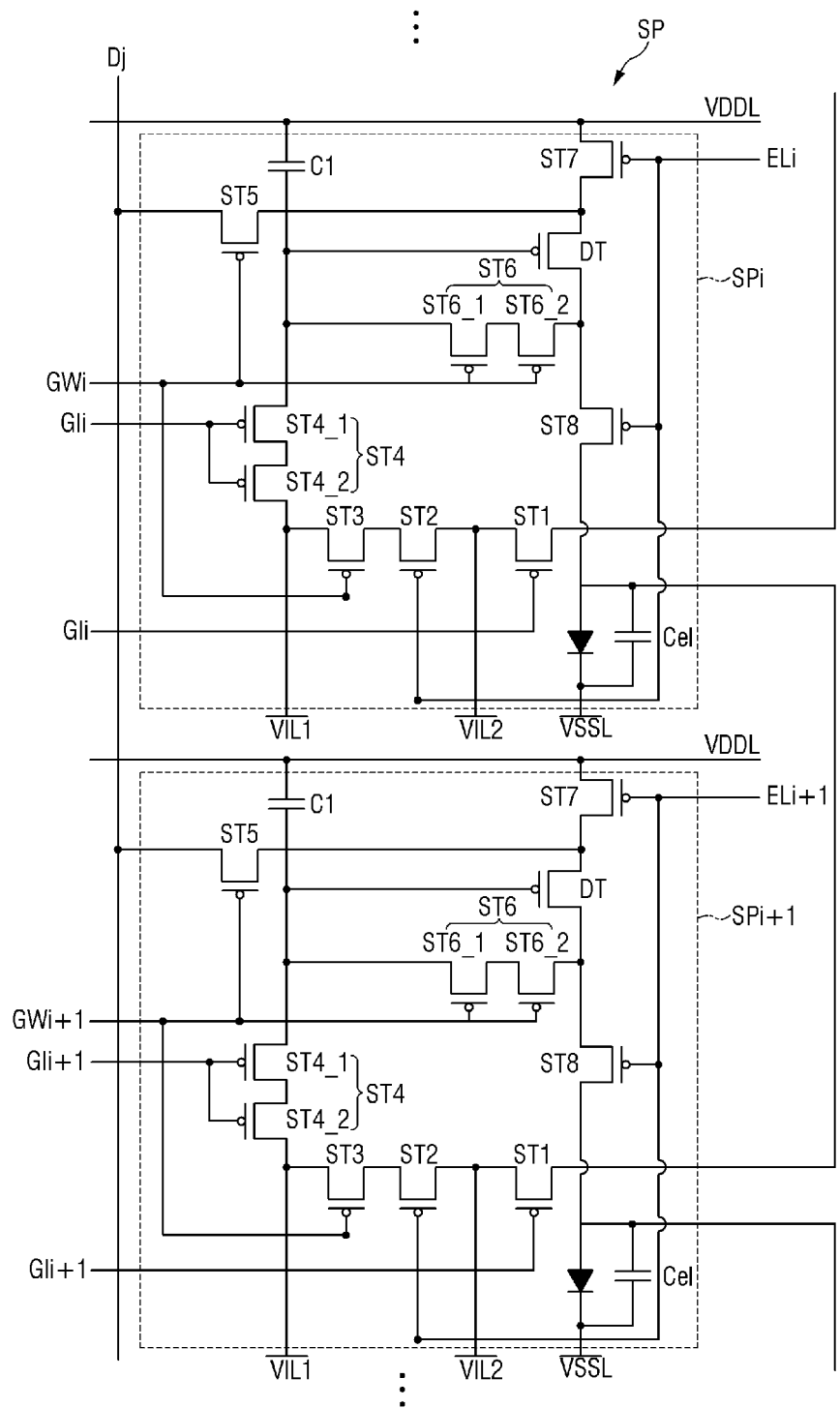
FIG. 19 is a circuit diagram showing a sub-pixel according to yet another exemplary embodiment of the present disclosure.

FIG. 19 is a circuit diagram showing a sub-pixel according to yet another exemplary embodiment of the present disclosure.

The exemplary embodiment of FIG. 19 is different from the exemplary embodiment of FIG. 4 in that a gate electrode of a second transistor ST2 of the $i^{th}$ sub-pixel SPi is connected to the $i^{th}$ emission control line Eli, and a gate electrode of a third transistor ST3 of the $i^{th}$ sub-pixel SPi is connected to a second scan line GWi. The following description will focus on the differences.

When the signals applied to the first scan line GIi, the second scan line GWi and the $i^{th}$ emission control line Eli connected to the $i^{th}$ sub-pixel SPi of FIG. 5 are applied to the $i^{th}$ sub-pixel SPi of FIG. 19, the second transistor ST2 and the third transistor ST3 of the $i^{th}$ sub-pixel SPi operate as follows during the first to third time periods t1 to t3.

During the first time period t1, the second transistor ST2 as well as the third transistor ST3 of the $i^{th}$ sub-pixel SPi are turned off, and the first initialization voltage line VIL1 and the second initialization voltage line VIL2 connected to the first $i^{th}$ sub-pixel SPi are electrically separated from each other.

During the second time period t2, the third transistor ST3 of the $i^{th}$ sub-pixel SPi is turned on while the second transistor ST2 of the $i^{th}$ sub-pixel SPi is turned off, and the first initialization voltage line VIL1 and the second initialization voltage line VIL2 connected to the first $i^{th}$ sub-pixel SPi are electrically separated from each other.

During the third time period t3, the second transistor ST2 of the $i^{th}$ sub-pixel SPi is turned on while the third transistor ST3 of the $i^{th}$ sub-pixel SPi is turned off, and the first initialization voltage line VIL1 and the second initialization voltage line VIL2 connected to the first $i^{th}$ sub-pixel SPi are electrically separated from each other.

That is to say, during the first to third time periods t1 to t3, the second transistor ST2 and the third transistor ST3 of the $i^{th}$ sub-pixel SPi are never turned on simultaneously, and thus it is possible to prevent the first initialization voltage line VIL1 and the second initialization voltage line VIL2 connected to the first $i^{th}$ sub-pixel SPi from being electrically connected with each other to form a short circuit.

As described above, according to the exemplary embodiments of the present disclosure, by adding the second and third transistors ST2 and ST3 between the first transistor ST1 and the fourth transistor ST4, the active layer of the first transistor ST1 can be connected to the active layer of the fourth transistor ST3 without being disconnected. Accordingly, the active layer of a sub-pixel may be formed integrally with the active layers of the adjacent sub-pixels SP in the second direction (y-axis direction). Therefore, when static electricity is applied to the active layer during the fabricating process, a path for discharging static electricity is formed by the active layers of the adjacent sub-pixels SP in the second direction (y-axis direction) so that the static electricity can be discharged to the outside or dispersed widely. Therefore, it is possible to prevent the active layer from being burnt and damaged by the static electricity during the process.

In addition, as the second transistor ST2 and the third transistor ST3 are never turned on simultaneously during the first time period t1 to the third time period, it is possible to prevent a short circuit between the first initialization voltage line VIL1 and the second initialization voltage line VIL2. By doing so, the first initialization voltage Vint1 applied to the gate electrode of the driving transistor DT and the second initialization voltage Vint2 applied to the anode electrode of the light emitting element EL can be uniformly applied without affecting each other.

Figure 20:
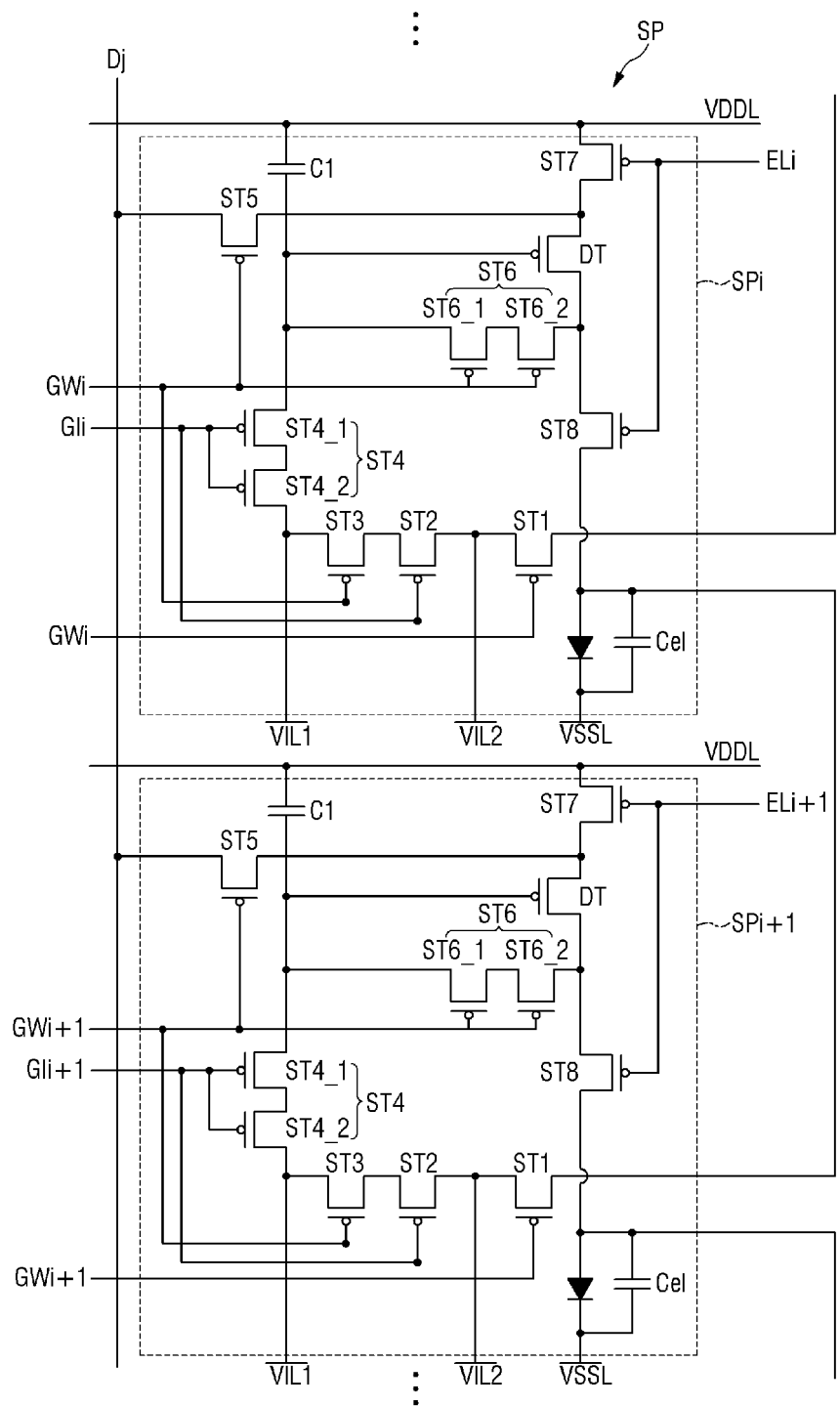
FIG. 20 is a circuit diagram showing a sub-pixel according to yet another exemplary embodiment of the present disclosure.

FIG. 20 is a circuit diagram showing a sub-pixel according to yet another exemplary embodiment of the present disclosure.

The exemplary embodiment of FIG. 20 is different from the exemplary embodiment of FIG. 4 in that a gate electrode of a first transistor ST1 of the $(i+1)^{th}$ sub-pixel SP(i+1) is connected to the second scan line GW(i+1) connected to the $(i+1)^{th}$ sub-pixel SP(i+1). The following description will focus on the differences.

When the gate electrode of the first transistor ST1 of the $(i+1)^{th}$ sub-pixel SP(i+1) is connected to the second scan line GW(i+1) connected to the $(i+1)^{th}$ sub-pixel SPi+1, the first transistor ST1 of the $(i+1)^{th}$ sub-pixel SP(i+1) is connected to a light-emitting element LE of the $i^{th}$ sub-pixel SPi. Therefore, a scan signal applied to the second scan line GW(i+1) connected to the $(i+1)^{th}$ sub-pixel SP(i+1) should have the waveform of the gate-off voltage Voff–the gate-on voltage Von–the gate-off voltage Voff during the $N^{th}$ frame (see FIG. 5) before an emission control signal applied to the $i^{th}$ emission control line ELi connected to the $i^{th}$ sub-pixel SPi has the gate-on voltage Von.

That is to say, the period in which the light-emitting element LE of the $i^{th}$ sub-pixel SPi is initialized to the second initialization voltage Vint2 as the first transistor ST1 of the $(i+1)^{th}$ sub-pixel SP(i+1) is turned on should precede the period in which the light-emitting element LE of the $i^{th}$ sub-pixel SPi emits light as the seventh transistor ST7 and the eighth transistor ST8 of the $i^{th}$ sub-pixel SPi are turned on.

Figure 21:
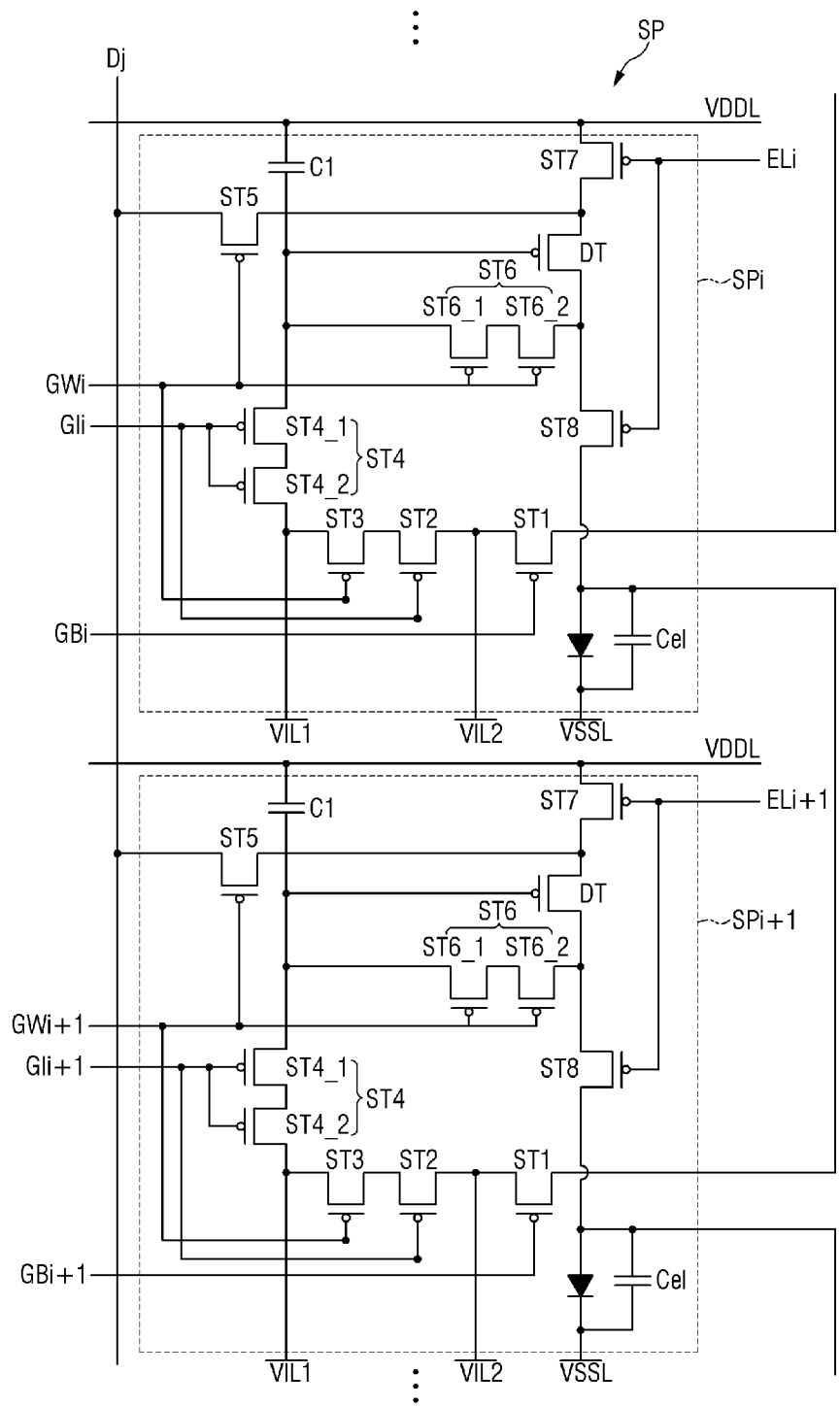
FIG. 21 is a circuit diagram showing a sub-pixel according to yet another exemplary embodiment of the present disclosure.

FIG. 21 is a circuit diagram showing a sub-pixel according to yet another exemplary embodiment of the present disclosure.

The exemplary embodiment of FIG. 21 is different from the exemplary embodiment of FIG. 4 in that a gate electrode of a first transistor ST1 of the $(i+1)^{th}$ sub-pixel SP(i+1) is connected to a third scan line GB(i+1) instead of the first scan line GI(i+1) and the second scan line GW(i+1) connected to the (i+1)$^{th}$ sub-pixel SP(i+1). The following description will focus on the differences.

When the gate electrode of the first transistor ST1 of the (i+1)$^{th}$ sub-pixel SP(i+1) is connected to a third scan line GB(i+1) different from the first scan line GI(i+1) and the second scan line GW(i+1) connected to the (i+1) sub-pixel SP(i+1), the first transistor ST1 of the (i+1)$^{th}$ sub-pixel SP(i+1) is connected to a light-emitting element LE of the i$^{th}$ sub-pixel SPi. Therefore, a scan signal applied to the third scan line GB(i+1) connected to the (i+1)$^{th}$ sub-pixel SP(i+1) should have the waveform of the gate-off voltage Voff–the gate-on voltage Von–the gate-off voltage Voff during the N$^{th}$ frame (see FIG. 5) before an emission control signal applied to the i$^{th}$ emission control line ELi connected to the i$^{th}$ sub-pixel SPi has the gate-on voltage Von.

That is to say, the period in which the light-emitting element LE of the i$^{th}$ sub-pixel SPi is initialized to the second initialization voltage Vint2 as the first transistor ST1 of the (i+1)$^{th}$ sub-pixel SP(i+1) is turned on should precede the period in which the light-emitting element LE of the i$^{th}$ sub-pixel SPi emits light as the seventh transistor ST7 and the eighth transistor ST8 of the ith sub-pixel SPi are turned on.

What is claimed is:

1. A display device comprising:
    a plurality of scan lines extended in a first direction;
    a plurality of data lines extended in a second direction intersecting the first direction, wherein data voltages are applied via the data lines;
    a first initialization voltage line from which a first initialization voltage is applied;
    a second initialization voltage line from which a second initialization voltage is applied; and
    a plurality of sub-pixels, each of the sub-pixels being connected to the first initialization voltage line, the second initialization voltage line, at least one of the plurality of scan lines, and at least one of the plurality of data lines,
    wherein each of the sub-pixels comprises:
        a driving transistor which controls a driving current which flows from a first electrode thereof to a second electrode thereof according to the data voltage applied to a gate electrode thereof;
        a light-emitting element electrically connected to the second electrode of the driving transistor;
        a first transistor comprising a first electrode connected to the second initialization voltage line; and
        a second transistor and a third transistor arranged in series between the first initialization voltage line and the second initialization voltage line, and
    wherein a second electrode of the first transistor of an (i+1)$^{th}$ sub-pixel disposed in an (i+1)$^{th}$ row among the sub-pixels is connected to the light-emitting element of an i$^{th}$ sub-pixel disposed in an i$^{th}$ row among the sub-pixels, where i is a positive integer, and
    wherein the (i+1)$^{th}$ sub-pixel and the i$^{th}$ sub-pixel are connected to a same data line among the plurality of data lines.

2. The display device of claim 1, wherein the second transistor and the third transistor of the i$^{th}$ sub-pixel are not turned on simultaneously.

3. The display device of claim 1, wherein a gate electrode of the first transistor and a gate electrode of the second transistor of the (i+1)$^{th}$ sub-pixel are connected to a first scan line connected to the (i+1)$^{th}$ sub-pixel among the plurality of scan lines.

4. The display device of claim 3, wherein a gate electrode of the third transistor of the i$^{th}$ sub-pixel is connected to a second scan line connected to the i$^{th}$ sub-pixel among the plurality of scan lines, and wherein a scan signal applied to the first scan line connected to the (i+1)$^{th}$ sub-pixel is identical to a scan signal applied to the second scan line connected to the i$^{th}$ sub-pixel.

5. The display device of claim 1, wherein a gate electrode of the first transistor and a gate electrode of the third transistor of the i$^{th}$ sub-pixel are connected to a second scan line connected to the i$^{th}$ sub-pixel among the plurality of scan lines.

6. The display device of claim 1, wherein a gate electrode of the second transistor of the i$^{th}$ sub-pixel is connected to a first scan line connected to the i$^{th}$ sub-pixel among the plurality of scan lines, and wherein a gate electrode of the third transistor of the i$^{th}$ sub-pixel is connected to a second scan line connected to the i$^{th}$ sub-pixel among the plurality of scan lines.

7. The display device of claim 6, wherein a gate electrode of the first transistor of the i$^{th}$ sub-pixel is connected to a third scan line connected to the i$^{th}$ sub-pixel among the plurality of scan lines.

8. The display device of claim 1, further comprising:
    a plurality of emission control lines extended in the first direction and arranged in parallel with the plurality of scan lines, wherein each of the sub-pixels is connected to at least one of the plurality of emission control lines.

9. The display device of claim 8, wherein a gate electrode of the second transistor of the i$^{th}$ sub-pixel is connected to a first scan line connected to the i$^{th}$ sub-pixel among the plurality of scan lines, and wherein a gate electrode of a third transistor of the i$^{th}$ sub-pixel is connected to the one of the plurality of emission control lines.

10. The display device of claim 8, wherein a gate electrode of the second transistor of the i$^{th}$ sub-pixel is connected to the one of the plurality of emission control lines, and wherein a gate electrode of the third transistor of the i$^{th}$ sub-pixel is connected to a first scan line connected to the i$^{th}$ sub-pixel among the plurality of emission control lines.

11. The display device of claim 1, further comprising:
    a plurality of driving voltage lines extended in the second direction; and
    a plurality of emission control lines extended in the first direction,
    wherein each of the sub-pixels is connected to at least one of the plurality of driving voltage lines and the plurality of emission control lines, and further comprises:
        a fourth transistor disposed between the gate electrode of the driving transistor and the first initialization voltage line;
        a fifth transistor disposed between one of the data lines and the first electrode of the driving transistor;
        a sixth transistor disposed between the gate electrode of the driving transistor and the second electrode of the driving transistor;
        a seventh transistor disposed between the one of the plurality of driving voltage lines and the first electrode of the driving transistor;
        an eighth transistor disposed between the second electrode of the driving transistor and a first electrode of the light-emitting element; and a first capacitor disposed between the one of the plurality of driving voltage lines and the gate electrode of the driving transistor.

12. The display device of claim 11, wherein a gate electrode of the first transistor, a gate electrode of the second transistor and a gate electrode of the fourth transistor of the $i^{th}$ sub-pixel are connected to a first scan line connected to the $i^{th}$ sub-pixel among the plurality of scan lines, wherein a gate electrode of the third transistor, a gate electrode of the fifth transistor and a gate electrode of the sixth transistor of the $i^{th}$ sub-pixel are connected to a second scan line connected to the $i^{th}$ sub-pixel among the plurality of scan lines, wherein a gate electrode of the first transistor of the $(i+1)^{th}$ sub-pixel is connected to a third scan line connected to the $(i+1)^{th}$ sub-pixel among the plurality of scan lines, and wherein a same scan signal is applied to the second scan line connected the $i^{th}$ sub-pixel and the third scan line connected the $(i+1)^{th}$ sub-pixel.

13. The display device of claim 11, wherein a gate electrode of the first transistor, a gate electrode of the third transistor and a gate electrode of the fourth transistor of the $i^{th}$ sub-pixel are connected to a first scan line connected to the $i^{th}$ sub-pixel among the plurality of scan lines, wherein a gate electrode of the second transistor, a gate electrode of the fifth transistor and a gate electrode of the sixth transistor of the $i^{th}$ sub-pixel are connected to a second scan line connected to the $i^{th}$ sub-pixel among the plurality of scan lines, wherein a gate electrode of the first transistor of the $(i+1)^{th}$ sub-pixel is connected to a third scan line connected to the $(i+1)^{th}$ sub-pixel among the plurality of scan lines, and wherein a same scan signal is applied to the second scan line connected the $i^{th}$ sub-pixel and the third scan line connected the $(i+1)^{th}$ sub-pixel.

14. The display device of claim 11, wherein a gate electrode of the first transistor, a gate electrode of the second transistor and a gate electrode of the fourth transistor of the $i^{th}$ sub-pixel are connected to a first scan line connected to the $i^{th}$ sub-pixel among the plurality of scan lines, wherein a gate electrode of the fifth transistor and a gate electrode of the sixth transistor of the $i^{th}$ sub-pixel are connected to a second scan line connected to the $i^{th}$ sub-pixel among the plurality of scan lines, wherein a gate electrode of the first transistor of the $(i+1)^{th}$ sub-pixel is connected to a third scan line connected to the $(i+1)^{th}$ sub-pixel among the plurality of scan lines, wherein a gate electrode of the third transistor of the $i^{th}$ sub-pixel is connected to one of the plurality of emission control lines, and wherein a same scan signal is applied to the second scan line connected the $i^{th}$ sub-pixel and the third scan line connected the $(i+1)^{th}$ sub-pixel.

15. The display device of claim 11, wherein a gate electrode of the first transistor and a gate electrode of the fourth transistor of the $i^{th}$ sub-pixel are connected to a first scan line connected to the $i^{th}$ sub-pixel among the plurality of scan lines, wherein a gate electrode of the second transistor, a gate electrode of the fifth transistor and a gate electrode of the sixth transistor of the $i^{th}$ sub-pixel are connected to a second scan line connected to the $i^{th}$ sub-pixel among the plurality of scan lines, wherein a gate electrode of the first transistor of the $(i+1)^{th}$ sub-pixel is connected to a third scan line connected to the $(i+1)^{th}$ sub-pixel among the plurality of scan lines, wherein a gate electrode of the third transistor of the $i^{th}$ sub-pixel is connected to one of the plurality of emission control lines, and wherein a same scan signal is applied to the second scan line connected the $i^{th}$ sub-pixel and the third scan line connected the $(i+1)^{th}$ sub-pixel.

16. The display device of claim 11, wherein a gate electrode of the first transistor, a gate electrode of the third transistor and a gate electrode of the fourth transistor of the $i^{th}$ sub-pixel are connected to a first scan line connected to the $i^{th}$ sub-pixel among the plurality of scan lines, wherein a gate electrode of the fifth transistor and a gate electrode of the sixth transistor of the $i^{th}$ sub-pixel are connected to a second scan line connected to the $i^{th}$ sub-pixel among the plurality of scan lines, wherein a gate electrode of the first transistor of the $(i+1)^{th}$ sub-pixel is connected to a third scan line connected to the $(i+1)^{th}$ sub-pixel among the plurality of scan lines, wherein a gate electrode of the second transistor of the $i^{th}$ sub-pixel is connected to one of the plurality of emission control lines, and wherein a same scan signal is applied to the second scan line connected the $i^{th}$ sub-pixel and the third scan line connected the $(i+1)^{th}$ sub-pixel.

17. The display device of claim 11, wherein a gate electrode of the first transistor and a gate electrode of the fourth transistor of the $i^{th}$ sub-pixel are connected to a first scan line connected to the $i^{th}$ sub-pixel among the plurality of scan lines, wherein a gate electrode of the third transistor, a gate electrode of the fifth transistor and a gate electrode of the sixth transistor of the $i^{th}$ sub-pixel are connected to a second scan line connected to the $i^{th}$ sub-pixel among the plurality of scan lines, wherein a gate electrode of the first transistor of the $(i+1)^{th}$ sub-pixel is connected to a third scan line connected to the $(i+1)^{th}$ sub-pixel among the plurality of scan lines, wherein a gate electrode of the second transistor of the $i^{th}$ sub-pixel is connected to one of the plurality of emission control lines, and wherein a same scan signal is applied to the second scan line connected the $i^{th}$ sub-pixel and the third scan line connected the $(i+1)^{th}$ sub-pixel.

18. A display device comprising:

a first initialization voltage line from which a first initialization voltage is applied;

a second initialization voltage line from which a second initialization voltage is applied; and a plurality of sub-pixels, each of the sub-pixels being connected to the first initialization voltage line and the second initialization voltage line, wherein each of the sub-pixels comprises:

a driving transistor which controls a driving current flowing from a first electrode thereof to a second electrode thereof according to a data voltage applied to a gate electrode thereof;

a light-emitting element electrically connected to the second electrode of the driving transistor;

a first transistor comprising a first electrode connected to the second initialization voltage line;

a second transistor and a third transistor arranged in series between the first initialization voltage line and the second initialization voltage line; and a fourth transistor disposed between the gate electrode of the driving transistor and the first initialization voltage line, wherein a second electrode of the first transistor of an $(i+1)^{th}$ sub-pixel disposed in an $(i+1)^{th}$ row among the sub-pixels is connected to the light-emitting element of an $i^{th}$ sub-pixel disposed in an $i^{th}$ row, where i is a positive integer, and wherein at least one of the second transistor and the third transistor is turned off in each of a first time period, a second time period and a third time period, wherein the first initialization voltage is applied to the gate electrode of the driving transistor during the first time period, the data voltage is applied to the gate electrode of the driving transistor during the second time period, and the light-emitting element emits light during the third time period.

19. The display device of claim 18, wherein the second transistor and the fourth transistor of the $i^{th}$ sub-pixel are turned on during the first time period,
wherein the first transistor of the $(i+1)^{th}$ sub-pixel is turned on during the second time period, and
wherein the third transistor of the $i^{th}$ sub-pixel is turned on during one of the second time period and the third time period.

20. The display device of claim 18, wherein the fourth transistor of the $i^{th}$ sub-pixel is turned on during the first time period,
wherein the second transistor of the $i^{th}$ sub-pixel and the first transistor of the $(i+1)^{th}$ sub-pixel are turned on during the second time period, and
wherein the third transistor of the $i^{th}$ sub-pixel is turned on during one of the first time period and the third time period.

21. The display device of claim 18, wherein the fourth transistor of the $i^{th}$ sub-pixel is turned on during the first time period,
wherein the first transistor of the $(i+1)^{th}$ sub-pixel is turned on during the second period,
wherein the second transistor of the $i^{th}$ sub-pixel is turned on during the third period, and
wherein the third transistor of the $i^{th}$ sub-pixel is turned on during one of the first period and the second period.

22. A display device comprising:
a plurality of scan lines; and
a plurality of sub-pixels, each of the sub-pixels comprising a driving transistor, a plurality of transistors connected to the plurality of scan lines, and a light-emitting element electrically connected to the driving transistor,
wherein each of the sub-pixels comprises an active layer comprising a channel region, a first electrode, and a second electrode of each of the plurality of transistors,
wherein a first scan line among the plurality of scan lines comprises a first extension extended in a first direction and a first protrusion extended in a second direction intersecting the first direction,
wherein the active layer overlaps with the first protrusion in a plan view, and
wherein the active layer of a first sub-pixel of the sub-pixels is connected to the active layer of a second sub-pixel of the sub-pixels adjacent to the first subpixel in the second direction.

23. The display device of claim 22, wherein a second scan line among the plurality of scan lines comprises a second extension extended in the first direction and a second protrusion extended in the second direction, and
wherein the active layer overlaps with the second protrusion in the plan view.

24. The display device of claim 23, wherein the active layer of an $i^{th}$ sub-pixel among the plurality of sub-pixels is monolithic with the active layer of an $(i+1)^{th}$ sub-pixel adjacent to the $i^{th}$ sub-pixel in the second direction, where i is a positive integer.

25. The display device of claim 23, wherein a first length between the first protrusion and the second extension is different from a second length between the second protrusion and the first extension.

26. The display device of claim 23, further comprising:
a first initialization voltage line from which a first initialization voltage is applied; and
a second initialization voltage line from which a second initialization voltage is applied,
wherein the driving transistor controls a driving current which flows from a first electrode thereof to a second electrode thereof according to a data voltage applied to a gate electrode thereof;
wherein the plurality of transistors comprises:
a first transistor comprising a first electrode connected to the second initialization voltage line; and
a second transistor disposed between the first transistor and the first initialization voltage line, and
wherein a region where the active layer and the first protrusion overlap each other in the plan view is defined as a channel region of the second transistor.

27. The display device of claim 26, wherein the plurality of transistors further comprises a third transistor disposed between the second transistor and the first initialization voltage line, and
wherein a region where the active layer and the second protrusion overlap each other in the plan view is defined as a channel region of the third transistor.

28. The display device of claim 27, further comprising:
a first initialization voltage connection line connected to the first initialization voltage line and extended in the second direction, and
wherein the active layer overlaps the first initialization voltage connection line in the plan view.

29. The display device of claim 28, wherein the channel region of the third transistor overlaps the first initialization voltage connection line in the plan view.

* * * * *